US004001774B2

United States Statutory Invention Registration [19]

[11] Reg. Number: H1774

Miyachi

[45] Published: Jan. 5, 1999

[54] PROJECTING EXPOSURE APPARATUS AND METHOD OF EXPOSING A CIRCUIT SUBSTRATE

[76] Inventor: Takashi Miyachi, 2-2-45-604, Ningyo, Kounosu-shi, Saitama-ken, Japan

[21] Appl. No.: 621,486

[22] Filed: Mar. 25, 1996

[30] Foreign Application Priority Data

Jun. 29, 1995 [JP] Japan ..... 7-163335
Jul. 3, 1995 [JP] Japan ..... 7-166728

[51] Int. Cl.[6] ..... H01L 21/30
[52] U.S. Cl. ..... 355/67
[58] Field of Search ..... 355/43–45, 53, 355/67–69; 250/398, 548, 492.1, 492.2, 492.3; 156/400, 401

[56] References Cited

U.S. PATENT DOCUMENTS 4,704,020 11/1987 Murakami et al. ..... 355/53
4,999,699 3/1991 Sakamoto et al. ..... 355/53
5,461,237 10/1995 Wakamoto et al. ..... 250/548
5,475,490 12/1995 Hirukawa et al. ..... 355/53

*Primary Examiner*—Daniel T. Pihulic

[57] ABSTRACT

A scanning projection exposure apparatus having a projection optical system (11), for serially transferring a pattern on a reticle (7) onto a wafer (12). The exposure apparatus control the position and/or the tilt angle of the wafer (12) such that the surface of the wafer (12) may be continuously adjusted during the scanning exposure operation so as to be coincident with an image plane of the projection optical system (11), with a high tracking accuracy, even when the image plane of the projection optical system (11) tends to vary during the scanning exposure operation. An image of that portion of the pattern on the reticle (7) which is confined in an illumination area (8) is formed in a plane through the projection optical system. This plane is used as a first reference plane (62). Parameters of the first reference plane (62) such as the tilt angle $\theta_p$ are determined by measurement. An image plane is defined by conjugate images (formed on the wafer side) of the points passing the center of the illumination area (8) when the reticle (7) is moved for scanning in the X-direction. This image plane is used as a second reference plane (65). The tilt angle $\Theta_x$ of the second reference plane (65) is determined by measurement. When the scanning exposure operation is performed, the tilt angle of the illumination field (13) of the wafer (12) is made coincident with that of the first reference plane (62), and the focusing position of the wafer (12) is made coincident with that of the second reference plane (65).

26 Claims, 11 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PROJECTING EXPOSURE APPARATUS AND METHOD OF EXPOSING A CIRCUIT SUBSTRATE

BACKGROUND OF THE INVENTION

1. Field of the Invention

The present invention relates to a projection exposure apparatus for use in photolithographic processes or fabricating semiconductor devices (such as LSIs), imaging devices (such as CCDs), liquid crystal displays (LCDs), thin film magnetic heads and others. More particularly, the present invention relates to a scanning exposure type of projection exposure apparatus, such as of a so-called step-and-scan type, in which a mask and a photosensitized substrate are moved for scanning in synchronism with each other and relative to an exposure optical system, so as to serially transfer a pattern formed on the mask onto the photosensitized substrate.

2. Description of the Related Art

The photolithography technique is commonly used in fabrication of semiconductor devices and the like. For this technique, there are used step-and-repeat type of projection exposure apparatuses (such as steppers) in which a pattern formed on a reticle (serving as a mask) is projected through a projection optical system onto each of shot areas defined on a photoresist-coated wafer (or glass plate, etc.). More recently, as larger and larger chips of semiconductor devices are being fabricated, it has become desired to make a projection exposure having a much larger pattern onto a wafer. In order to meet this desire, there has been developed a scanning exposure type of projection exposure apparatus in which a reticle and a wafer are moved for scanning in synchronism with each other and relative to a projection optical system, so that a shot area having a larger extent than the effective exposure field of the projection optical system may be exposed.

One of the known types of projection exposure apparatuses using the scanning exposure technique is the aligner, in which the entire region of the pattern on one reticle is serially projected onto the entire region of the surface of one photosensitized substrate by using a 1:1 projection optical system. More recently, there has been developed a step-and-scan type of projection exposure apparatus, in which each of shot areas on a wafer is exposed by demagnification projection scanning exposure and the exposure site is moved from one shot area to another by stepping the wafer.

In general, the projection exposure apparatus uses a projection optical system which has a large numerical aperture (NA) and thus a very shallow focal depth, so that a certain type of mechanism must be provided for keeping the surface of the wafer coincident with the image plane of the projection optical system so as to enable transfer of a fine circuit pattern with a high resolution.

Therefore, in a conventional one-shot exposure type of projection exposure apparatus, a tilt sensor (or leveling sensor) is provided to measure a tilt angle of the surface of the wafer relative to the guide plane (or slide plane) of the wafer stage. Further, a tilt angle of the image plane of the projection optical system relative to that guide plane is also measured and stored as preparatory data. Then, the tilt angle of the surface of the wafer is controlled by servo-control technique such that the measured value supplied by the tilt sensor may converge to the tilt angle of the image plane and thereby the surface of the wafer is made parallel to the image plane. In addition, by performing such control of the tilt angle (auto-leveling control) together with the so-called auto-focusing control for causing the height of the surface (focusing position) of the wafer to be coincident with the image plane of the projection optical system, the entire region of each shot area on the wafer is kept falling within the range of focal depth about the image plane. So far, the scanning exposure type of projection exposure apparatus also uses essentially the same control technique as that for the one-shot exposure type of projection exposure apparatus as described above, in order to cause the surface of the wafer to be coincident with the image plane.

In the scanning exposure technique, an image of a portion of the pattern on the reticle is projected through the projection optical system onto the wafer and within a slit-like projection exposure area on the wafer (this area is referred to as the "illumination field" hereinafter). In contrast, the area on the wafer within which the entire pattern on the reticle is serially projected, and thus which is larger than the illumination field, is referred to as the "exposure field" (corresponding to a shot area).

In a typical conventional scanning exposure apparatus, and in particular in the demagnification projection step-and-scan type of projection exposure apparatus, the reticle and the wafer are moved for scanning independently of each other and relative to the projection optical system, so that the slide plane of the reticle and that of the wafer are established independently. Further, because it is impossible to achieve the perfect parallelism between the slide plane of the reticle and the pattern surface of the reticle, the level (height) of the image plane of the projection optical system (i.e., the plane in which the image of the pattern on the reticle is formed through the projection optical system) may gradually vary as the position of the reticle in the scanning direction varies. Such gradual variation of the level of the image plane may cause a tracking error if the response speed of the auto-focusing control is relatively low, resulting in that a portion of the surface of the wafer within the exposure field (shot area) may not fall within the range of focal depth relative to the image plane.

Because the auto-focusing (AF) sensor and the tilt sensor are used for detecting the focusing position and the tilt angle, respectively, of that portion of the surface of the wafer which is confined within the projection exposure area (or the slit-like illumination field in the case of the scanning exposure type), the detection areas of these sensors are generally confined within the projection exposure area (or the slit-like illumination field). For this reason, in a conventional control sequence, the focusing and leveling control is performed only during the time period when an exposure area on the wafer is actually exposed. Thus, during the time period when the exposure site moves from one projection exposure area to another, the focusing and leveling control is made inoperative and the positions of the Z-stage and the tilt-stage are kept fixed. Then, when the positioning of the wafer for the new projection exposure area (or the new scanning start position) has been made, the focusing and leveling control is restarted. This control sequence is utilized because the whole path of the movement of the exposure site from one projection exposure area (or the scanning start position) to the next may not necessarily be confined within the regions which are detectable, but may be within the regions which are not detectable, so that it is difficult to continue the focusing leveling control. In the case where the focusing and leveling control is made inoperative during the movement to the next location, the focusing position of the surface of the wafer may significantly vary after such movement if the wafer surface is inclined relative to the guide plane of the wafer stage. This results in large initial adjustments (which equal the focusing error, that is, an amount of defocusing and the tilt angle error) required when the focusing and levelling control restarts at the next illumination field to be exposed, thus a longer settling time (adjustment time) is required for these errors to settle within allowable ranges. This results in a drawback that the throughput of the exposure process (the number of wafers that can be exposed per unit of time) is reduced.

In particular, in a typical step-and-scan type of projection exposure apparatus, the focusing and levelling control of the wafer surface is continuously performed during the scanning exposure on each exposure area while the wafer is moved for scanning. Therefore, if there is on the surface of the wafer a region with a groove-like structure (such as so-called street lines for indicating the border between adjacent semiconductor chips sites on a wafer), which is inappropriate for the region from which measurements are derived for the focusing and levelling control, then the focusing and levelling control may be disturbed, resulting in a lower tracking accuracy as well as a longer settling time.

SUMMARY OF THE INVENTION

In view of the foregoing, it is an object of the present invention to provide a projection exposure apparatus having a projection optical system, in which the surface of a wafer may be kept coincident with the image plane of the projection optical system continuously during the scanning exposure operation with high tracking accuracy, even when the level (height) of the image plane tends to vary during the scanning exposure operation.

It is another object of the present invention to provide a projection exposure apparatus, in which the deviation (error) in the focusing position which exists when the focusing control restarts may be reduced (it restarts after the detection area for the control has passed the region on a wafer which is inappropriate for measurement for the focusing control and includes surface irregularities, or after the detection area has entered in the surface of the wafer from outside), resulting in a shorter adjustment time (settling time) for completing the initial adjustment just after the restart.

In accordance with an aspect of the present invention, there is provided a projection exposure apparatus having a projection optical system (11) with an optical axis, in which a mask (7) having a pattern formed thereon is illuminated, and the mask (7) and a photosensitized substrate (12) are moved for scanning in synchronism with each other and relative to the projection optical system (11) while an image of a portion of the pattern on the mask is projected through the projection optical system (11) onto a predetermined exposure area (illumination field 13) on the substrate (12), the projection exposure apparatus comprising: a position detection sensor (25) for detecting a tilt angle of the predetermined exposure area (13) on the substrate (12) and a focusing position of the predetermined exposure area (13) measured in the direction of the optical axis of the projection optical system (11); a tilt angle control unit (16A–16C, 20) for controlling the tilt angle of the substrate (12) such that the tilt angle detected by the position detection sensor (25) may be coincident with a tilt angle of a first reference plane (62), the first reference plane (62) being defined by a projected image of the mask (7) formed through the projection optical system (11); and a focusing position control unit (16A–16C, 20) for controlling the focusing position of the substrate (12) such that the focusing position detected by the position detection sensor (25) may be coincident with a focusing position of a second reference plane (65), the second reference plane (65) being defined depending on a tilt angle ($\Theta_x$) of a slide plane **(10*a*) of the mask (7) toward the scanning direction and on the tilt angle of the mask (7)**.

In other words, according to the above projection exposure apparatus of the present invention, the first reference plane (62) relating to the exposure area (illumination field) of the projected image of a portion of the pattern on the mask, and the second reference plane (65) relating to the exposure field on the substrate (12) and obtained as the result of the scanning exposure operation, are both utilized such that the control of the tilt angle of the substrate (12) is performed based on the tilt angle of the first reference plane (62) while the control of the focusing position of the substrate (12) is performed based on the focusing position of the second reference plane (65).

It is desirable in this relation that the variation in the tilt angle of the first reference plane (62) and the variation in the focusing position of the second reference plane (65) are preparatorily determined and stored in the tilt angle control unit (16A–16C, 20) and the focusing position control unit (16A–16C, 20), respectively.

The principle of the present invention as outlined above will be described in more detail below with reference to FIGS. 8A and 8B which show a critical portion of one embodiment of the present invention. In FIG. 8A, the two-dimensional tilt angles of the slide plane (guide plane) **(17*a*) of the stage system (14, 15X, 15Y), which serves to move the substrate (12), is set to be the reference value (0, 0). The two-dimensional tilt angles may be represented, for example, by the tilt angles about the Y-axis and the X-axis, respectively. The X- and Y-axes are of the rectangular coordinate system defined with respect to a plane perpendicular to the optical axis of the projection optical system. The image plane of the illumination field (13) in which an image of a portion of the pattern (8) on the mask is projected is used as the first reference plane (62). The tilt angles of the first reference plane (62) relative to the slide plane (17*a*) are designated by ($\theta_{xp}$, $\theta_{yp}$). Then, the tilt angle control unit controls the tilt angles of the surface of the substrate (12) by using the tilt angles ($\theta_{xp}$, $\theta_{yp}$) of the first reference plane as the desired values of the tilt angles. In this manner, the surface of the substrate (12) is set to be parallel to the first reference plane (62)**.

When the mask (7) and the substrate (12) are moved for scanning under this condition, the focusing position (height) of the substrate (12) varies depending on the position of the substrate (12) in the scanning direction because the first reference plane (62) is inclined relative to the slide plane **(17*a*). It is assumed here that the substrate (12) is moved for scanning in the +X-direction. Then, the relationship between the focusing position $z_o$ when the substrate (12) is in the position shown in FIG. 8A and the focusing position $Z_A$ when the substrate (12) is in the position shown in FIG. 8B** is approximately expressed as:

$$z_A=(X-X_0)\theta_{xp}+z_0 \quad \text{(formula 1)}$$

To consider the influences of the movement of the mask (7) for scanning, it is also assumed that the pattern bearing surface of the mask (7) has a tilt relative to the slide plane **(10*a*) toward the scanning direction with a certain tilt angle. This results in that the position of the image plane at the center of the illumination field is displaced along the second reference plane (65), which is the plane having a tilt angle toward the scanning direction (i.e., the tilt angle about the Y-axis) of $\Theta_x$, when the mask (7) is moved in the X-direction for scanning, as shown in FIG. 8B. The position of the mask (7) in the X-direction shown in FIG. 8A and that shown in FIG. 8B are designated by $x_o$ and x, respectively, and the magnification ratio of the projection optical system 11** is designated by β (the value of β is ¼ or ⅕, for example). Then, if the projection optical system projects an inverted image, the following relationship is satisfied.

$$X-X_0=-\beta(x-x_0) \quad \text{(formula 2)}$$

Since the tilt angle of the second reference plane (65) is $\Theta_x$ and the focusing position when the substrate (12) is in the position $X_0$ shown FIG. 8A is $z_0$, the focusing position at the center of the illumination field when the substrate (12) is in the position shown in FIG. 8B will be the focusing position $z_B$ expressed by formula 3 below.

$$z_B=(X-X_0)\Theta_X+z_0 \quad \text{(formula 3)}$$

Therefore, the focusing control (auto-focusing control) may be performed by using the focusing position $Z_B$ as the desired position. In fact, however, the focusing position of the substrate (12) varies as indicated by the focusing position $Z_A$ shown in formula 1 above, and thus there is an amount of defocusing (focusing error) δz expressed as:

$$\delta z=z_B-z_A=(X-X_0)(\Theta_x-\theta_{xp}) \quad \text{(formula 4)}$$

Accordingly, the actual focusing control (auto-focusing control) should be performed such that the amount of defocusing may be reduced to zero. Further, the tilt angle $\theta_{xp}$ of the first reference plane (62) and the tilt angle $\Theta_x$ of the second reference plane (65) may be determined by, for example, performing test printing operations, and stored as preparatory data. In this manner, the focusing position of the substrate (12) may be varied to follow the projection plane of the entire mask (7), while the tilt angle of the substrate (12) may be made coincident with the image plane of the projected image in the illumination field of the mask (7).

In accordance with another aspect of the present invention, there is provided a projection exposure apparatus including a projection optical system (11) for projecting a pattern on a mask (7) onto a photosensitized substrate (12) and a substrate stage (14, 15X, 15Y, 17) for moving the substrate on the image plane side of the projection optical system (11), in which an image of the pattern on the mask (7) is projected on the substrate (12) which is positioned by the substrate stage, the projection exposure apparatus comprising: a substrate focusing position detection sensor (25) for detecting a focusing position of the substrate (12) measured in the direction of the optical axis of the projection optical system (11); a stage focusing position detection sensor (43) for detecting a height of the substrate stage (14, 15X, 15Y, 17) measured in the direction of the optical axis of the projection optical system (11); a focusing position selection unit (154, 155) for selecting one of first and second focusing positions depending on the condition of the surface of the substrate (12), the first focusing position being the focusing position detected by the substrate focusing position detection sensor (25) and the second focusing position being the focusing position determined based on the height detected by the stage focusing position detection sensor (43); and a focusing position control unit (16A–16C) for controlling the focusing position of the substrate (12) depending on the focusing position selected by the focusing position selection unit (154, 155).

When the detection area of the substrate focusing position control sensor (25) is routed from one projection exposure area to another through the region outside the substrate (12) as shown in FIG. 11A, the focusing position detection by the substrate focusing position detection sensor (25) has to be discontinued. In such case, according to the above arrangement, the focusing control is performed on a simulation basis by using the second focusing position determined by summing the height of the substrate stage detected by the stage focusing position detection sensor (43) and a predetermined offset, for example. In this manner, the focusing error existing when the focusing control using the substrate focusing position detection sensor (25) restarts may be reduced.

In accordance with a further aspect of the present invention, there is provided a scanning exposure apparatus including a projection optical system (11) for projecting an image of a portion of a pattern on a mask (7) onto a photosensitized substrate (12) and within a predetermined exposure area (13) defined on the substrate (12), and a substrate stage (14, 15X, 17Y, 17) for moving the substrate (12) on the image plane side of the projection optical system (11), in which the mask (7) and the substrate (12) are moved for scanning in synchronism with each other and relative to the projection optical system (11) so as to serially transfer an image of the pattern on the mask (7) onto the substrate (12), said scanning exposure apparatus comprising: a substrate focusing position detection sensor (25) for detecting the focusing position of the substrate (12) measured in the direction of the optical axis of the projection optical system (11); a stage focusing position detection sensor (16A) for detecting the height of the substrate stage measured in the direction of the optical axis of the projection optical system (11); a storage unit (155) for storing step-like structure data as the design data; a focusing position selection unit (154) for selecting one of a first focusing position (z) and a second focusing position (z') depending on the step-like structure data of the substrate (12) stored in the storage unit (155), the first focusing position (z) being the focusing position detected by the substrate focusing position detection sensor (25) and the second focusing position (z') being the focusing position determined based on the height (PZ) detected by the stage focusing position detection sensor (16A); and a focusing position control unit (16A-16C) for controlling the focusing position of the substrate (12) depending on the focusing position selected by the focusing position selection unit (154).

The above projection exposure apparatus is a scanning exposure type of projection exposure apparatus. In this relation, a projection exposure area on the substrate (12) may include a groove-like structure such as a street line, as shown in FIG. 11C, for example. If the focusing control using the substrate focusing position detection sensor (25) is continuously performed within such projection exposure area, the tracking accuracy is significantly lowered when the detection area of this sensor has passed the groove-like structure (68). Accordingly, in such projection exposure area including the groove-like structure (68), the focusing control based on the second focusing position may be performed in which the second focusing position is determined by, for example, summing the height detected by the stage focusing position detection sensor (16A) and a predetermined offset, and this provides a good tracking accuracy when the former control mode restarts.

In this arrangement, it is desirable to provide an arithmetic operation unit (158) for predicting the second focusing position (z') based on the height (PZ) detected by the stage focusing position detection sensor (43) and on a predetermined model. The predetermined model may include data representing a step-like structure in a projection exposure area on the substrate (12).

BRIEF DESCRIPTION OF THE DRAWINGS

The above and other objects, features and advantages of the present invention will be apparent from the following detailed description of preferred embodiments thereof, reference being made to the accompanying drawings, in which:

FIGS. 7, 7A and 7B are a schematic representation showing focusing/levelling mechanism for the wafer 12 of FIG. 1 and associated control system, in which a part of the arrangement is shown in a perspective view;

FIG. 10, 10A and 10B are a schematic representation showing focusing/levelling mechanism for the wafer 12 of FIG. 1 and associated control system, in which a part of the arrangement is shown in a perspective view;

DETAILED DESCRIPTION A PREFERRED EMBODIMENT

Referring now to the accompanying drawings, a preferred embodiment of the projection exposure apparatus in accordance with the present invention will be described in detail. This embodiment shows an exemplified application of the present invention to a step-and-scan type of projection exposure apparatus.

Figure 1:
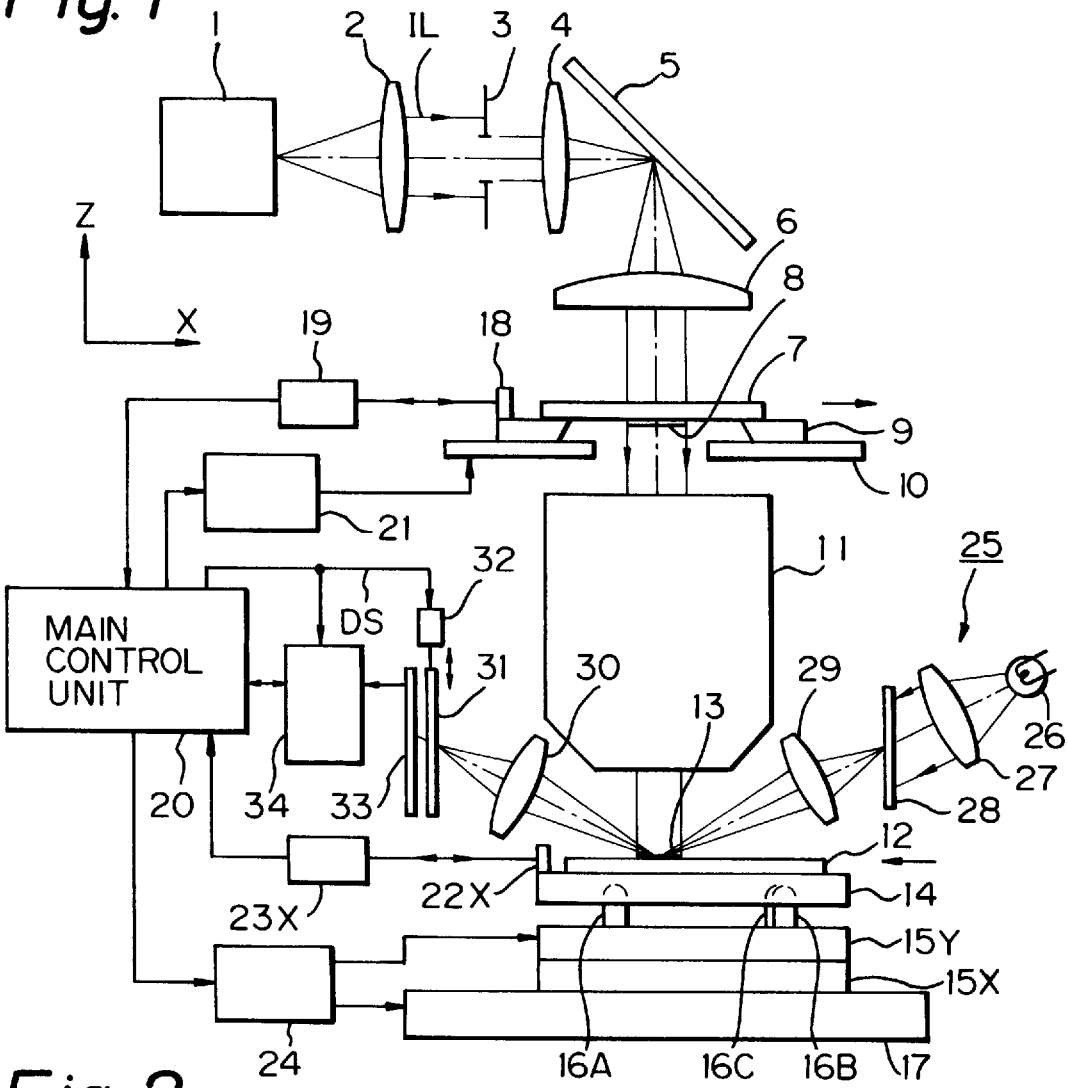
FIG. 1 is a schematic representation showing a projection exposure apparatus of a step-and-scan type to which one embodiment of the present invention is applied.

FIG. 1 shows the projection exposure apparatus, in which a light source system 1 comprising a light source and an optical integrator emits an illumination beam IL for exposure. The illumination beam IL passes through a first relay lens 2, a reticle blind (variable field stop) 3, a second relay lens 4, is reflected by a mirror 5, passes through a main condenser lens 6, and illuminates that portion of a pattern bearing surface (bottom surface) of a reticle 7 which is then confined in a slit-like illumination area 8 with a uniform illumination distribution. The reticle blind 3 is positioned in a plane substantially conjugate to the plane of the pattern bearing surface of the reticle 7, so that the position and the geometry of the aperture of the reticle blind 3 determine the position and the geometry of the illumination area 8.

An image of that portion of the pattern on the reticle 7 which is confined in the illumination area 8, which is formed through a projection optical system 11, is projected for exposure onto a photoresist-coated wafer 12 and within a slit-like illumination field 13 on the wafer 12. For specifying positions and directions in the disclosed arrangement, we use here a three-dimensional rectangular coordinate system with the X-, Y- and Z-axes, in which the Z-axis extends parallel to the optical axis of the projection optical system 11, the X-axis extends perpendicular to the optical axis and parallel to the sheet surface of FIG. 1 and the Y-axis extends perpendicular to the sheet surface of FIG. 1. The reticle 7 is held on a reticle stage 9 which, in turn, is supported on a reticle base 10 for translational movement in the x-direction, or the scanning direction, by means of a drive unit such as a linear motor (not shown). A moving mirror 18 is fixedly mounted on the reticle stage 9 for movement with the latter. A laser interferometer 19 is fixedly mounted on a stationary member outside the reticle stage 9. The moving mirror 18 and the laser interferometer 19 are used to measure the X-coordinate of the reticle 7. The measured X-coordinate of the reticle 7 is supplied to a main control system 20 which serves to generally control various operations in the entire projection exposure apparatus. The main control system 20 controls the position and the velocity of the reticle 7 through the reticle stage drive system 21 and the reticle stage 9.

On the other hand, the wafer 12 is held on a Z/tilt-stage 14 by means of a wafer holder (not shown). The Z/tilt-stage 14 is mounted on a Y-stage 15Y by means of three actuators 16A, 16B and 16C each interposed between them and being capable of providing displacement of an acting point in the Z-direction. The Y-stage 15Y is mounted on an X-stage 15X for movement in the Y-direction by means of a suitable mechanism such as a feedscrew mechanism. The X-stage 15X is mounted on a machine base 17 for movement in the X-direction by means of a suitable mechanism such as a feedscrew mechanism. The Z/tilt-stage 14 may be adjusted with respect to the Z-direction position (the focusing position) by operating the three actuators 16–A16C so as to provide the same displacement in the Z-direction, while may be adjusted with respect to the tilt angles about the X- and Y-axes by operating the three actuators 16–A16C so as to provide different displacements in the Z-direction.

Further, a moving mirror 22X for the X-direction position measurement is fixedly mounted on the top surface of the Z/tilt-stage 14, and an associated laser interferometer 23X is fixedly mounted on a stationary member outside the Z/tilt-stage 14. The moving mirror 22X and the laser interferometer 23X are used to continuously monitor the X-coordinate of the wafer 12. Also, a moving mirror 22Y (see FIG. 7) for the Y-direction position measurement is fixedly mounted on the top surface of the Z/tilt-stage 14 and an associated laser interferometer 23Y is fixedly mounted on a stationary member outside the Z/tilt-stage 14. The moving mirror 22Y and the laser interferometer 23Y are used to continuously monitor the Y-coordinate of the wafer 12. The detected X- and Y-coordinates are supplied to the main control system 20.

An exemplified arrangement for the actuators 16–A16C will be described below.

Figure 6:
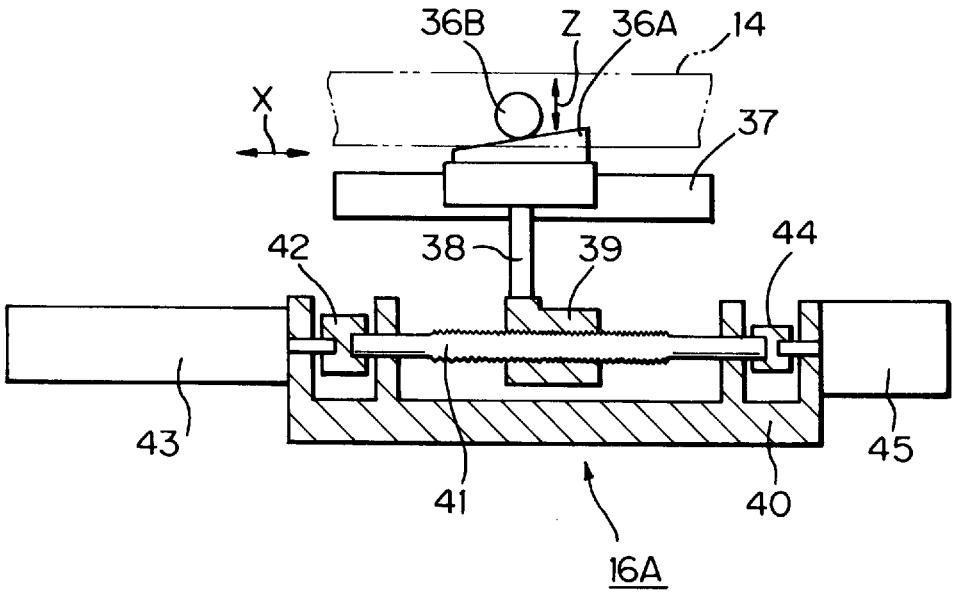
FIG. 6 is a schematic side elevation, partially broken out, showing an exemplified arrangement of actuator 16A of FIG. 1.

FIG. 6 shows a sectional elevation of the actuator 16A, in which a drive unit housing 40 is fixedly mounted on the Y-stage 15Y of FIG. 1. There is a feedscrew 41 disposed inside and supported by the drive unit housing 40. A rotary encoder 43 for detecting rotational angle is connected with the left-hand end of the feedscrew 41 through a coupling 42, and a rotary motor 45 is connected with the right-hand end of the feedscrew 41 through a coupling 44. The feedscrew 41 is in threading engagement with a nut 39 on which a cam member 36A with a slant cam surface at its top end is mounted through a support member 38. A roller (or follower) 36B is in contact with the slant cam surface of the cam member 36A. The roller 36B is received in a recess formed in the Z/tilt-stage 14 of FIG. 1, and rotatable in the recess, while immovable in any horizontal directions.

The cam member 36A is also guided by a linear guide 37 for translational movement parallel to the feedscrew 41. A control signal indicating a drive speed is produced from a stage control system 24 (FIG. 1) and supplied to the rotary motor 45, which drives the feedscrew 41 to rotate at the drive speed (angular velocity) indicated by the control signal. In this manner, the nut 39 is moved along the feedscrew 41 in the X-direction, together with the cam member 36A. Thus, the roller 36B, which is in contact with the slant cam surface at the top end of the cam member 36A, is displaced in the vertical direction (the Z-direction) relative to the drive unit housing 40, while being rotated. The angular velocity of the rotation of the feedscrew 41 is measured by means of the rotary encoder 43 and used to determine the velocity of the vertical movement of the roller 36B. The other actuators 16B and 16C have the same arrangement as the actuator 16A described above.

Alternatively, each of the actuators 16A–16C may comprise a stacked type of piezoelectric device or any other actuators which directly produce linear movements. Where each of the actuators 16A–16C comprises such an actuator, the encoder required for detecting the Z-direction position may comprise an optical or electrostatic linear encoder.

Referring again to FIG. 1, the main control system 20 operates the wafer stage drive system 24 based on the supplied coordinates, so as to control the operations of the X-stage 15X, Y-stage 15Y and Z/tilt-stage 14. For an example, where the exposure is performed using the scanning exposure technique and the projection optical system 11 projects an inverted image with a magnification ratio of β (the value of β is ¼, for example), then the reticle 7 is moved for scanning by the reticle stage 9 in the +X-direction (or in the −X-direction) relative to the illumination area 8 at a velocity of VR, while the wafer 12 is moved for scanning in synchronism with the movement of the reticle 7, by the X-stage 15X, in the −X-direction (or in the +X-direction) relative to the illumination field 13 at a velocity of VW (=β* VR).

In the following, an arrangement of a multipoint focusing position detection system (referred to as the "multipoint AF sensor" hereinafter) 25 will be described. The multipoint AF sensor 25 includes a light source 26 which emits a detection light beam to which the photoresist on the wafer has substantially no sensitivity. The detection light beam passes through a condenser lens 27 to illuminate a number of (fifteen) slits formed in the light-transmit slit plate 28, and thereby respective images of the slits are formed through an objective lens 29 and projected obliquely onto the wafer 12, at fifteen measurement points $P_{11}$–$P_{53}$ distributed in three regions on the wafer 12 including the illumination field 13 and two prereading areas 35A and 35B (see FIG. 2) preceding and following, respectively, the illumination field 13.

Figure 2:
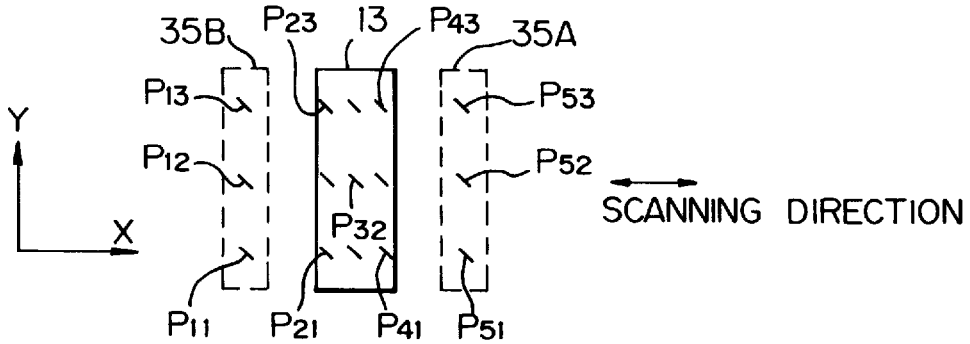
FIG. 2 is a plan view of the wafer 12 of FIG. 1 showing distribution of measurement points for measuring the focusing positions on the wafer 12.

FIG. 2 shows the arrangement or array of the measurement points $P_{11}$–$P_{53}$ on the wafer 12. As shown, the prereading areas 35A and 35B are established on the +X-direction side and the −X-direction side, respectively, of the slit-like illumination field 13. There are distributed nine of the measurement points $P_{21}$–$P_{43}$ (forming a three-row by three-column (3×3) matrix) in the illumination field 13, three of the measurement points $P_{11}$–$P_{13}$ in one prereading area 35B and three of the measurement points $P_{51}$–$P_{53}$ in the other prereading area 55A. In this embodiment, the data representing the focusing positions at the nine measurement points in the illumination field 13 is used to determine the average focusing position and the tilt angle of that portion of the wafer surface which is in the illumination field 13. Further, the data representing the focusing positions at the three measurement points in the prereading area 35A (or at those in the prereading area 35B) may be used for various purposes including the compensation for the step structure formed on the surface of the wafer 12 when necessary.

Referring again to FIG. 1, reflecting light beams from the measurement points are converged through a condenser lens 30 onto a vibrating slit plate 31, so that there are images formed on the vibrating slit plate 31, which are the images of the slit images projected on the wafer at the measurement points. The vibrating slit plate 31 is driven for vibration in a predetermined direction by a vibrator 32, which is, in turn, driven by the drive signal DS from the main control system 20. Light rays passed through a number of slits formed in the vibrating slit plate 31 are converted into respective electrical signals by a number of photodetectors disposed on a photodetector unit 33. The electrical signals are supplied to a signal conditioning system 34, and the conditioned signals are routed to the main control system 20.

Figure 3:
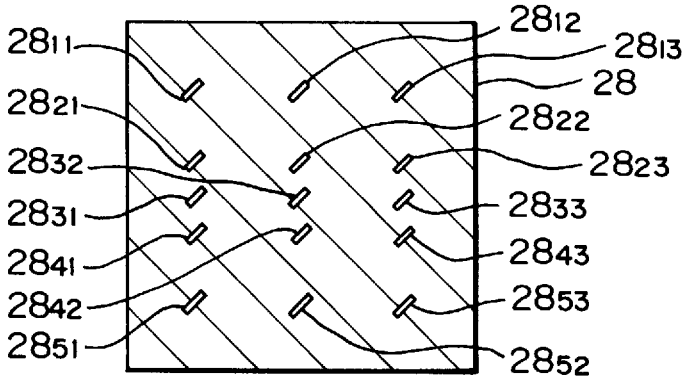
FIG. 3 shows light-transmit slit plate 28 of FIG. 1.
Figure 4:
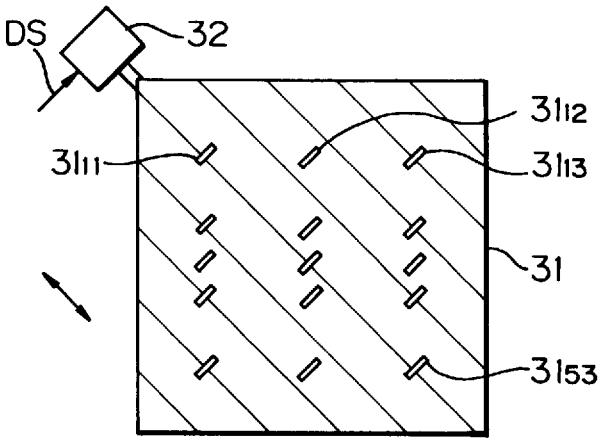
FIG. 4 shows vibrating slit plate 31 of FIG. 1.

FIG. 3 shows the light-transmit slit plate 28. As show, the light-transmit slit plate 28 has the slits $\mathbf{28}_{11}$–$\mathbf{28}_{53}$ formed therein at positions corresponding to the positions of the measurement points $P_{11}$–$P_{53}$ on the wafer of FIG. 2. Further, the vibrating slit plate 31 of FIG. 1 has the slits $\mathbf{31}_{11}$–$\mathbf{31}_{53}$ formed therein at positions corresponding to the positions of the measurement points $P_{11}$–$P_{53}$ on the wafer of FIG. 2. The vibrating slit plate 31 is driven by the vibrator 32 for vibration in the measuring direction perpendicular to the longitudinal direction of each slit formed therein.

Figure 5:
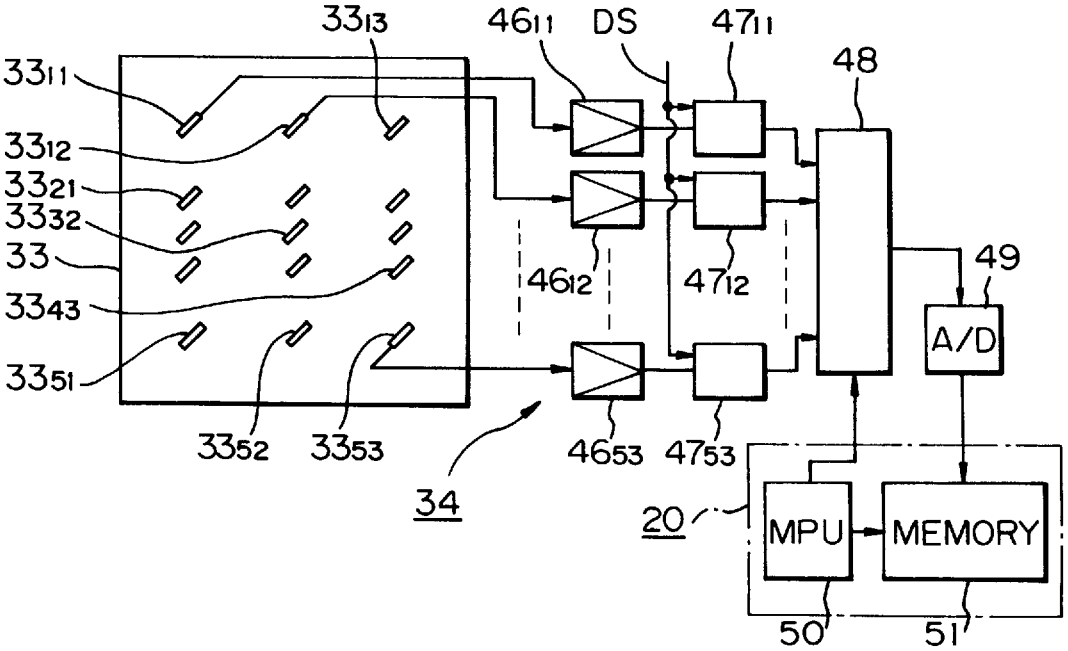
FIG. 5 is a schematic representation showing photodetector unit 33 and signal conditioning system 34 of FIG. 1.

FIG. 5 shows the photodetector unit 33 and the signal conditioning system 34. As shown, the photodetector unit 33 includes a first row of photodetectors $\mathbf{33}_{11}$–$\mathbf{33}_{13}$ for receiving the light beams reflecting from the measurement points $P_{11}$–$P_{13}$ of FIG. 2 and passed through the corresponding slits in the vibrating slit plate 31, respectively. The photodetector unit 33 further includes second to fourth rows of photodetectors $\mathbf{33}_{21}$–$\mathbf{33}_{43}$ for receiving the light beams reflecting from the measurement points $P_{21}$–$P_{43}$ of FIG. 2 and passed through the corresponding slits in the vibrating slit plate 31, respectively. The photodetector unit 33 further includes fifth row of photodetectors $\mathbf{33}_{51}$–$\mathbf{33}_{53}$ for receiving the light beams reflecting from the measurement points $P_{51}$–$P_{53}$ of FIG. 2 and passed through the corresponding slits in the vibrating slit plate 31, respectively. The photodetectors $\mathbf{33}_{11}$–$\mathbf{33}_{53}$ produce respective detection signals which are supplied to respective amplifiers $\mathbf{46}_{11}$–$\mathbf{46}_{53}$ and then to respective synchronized rectifiers $47_{11}$–$47_{53}$. The detection signals are input to the respective synchronized rectifiers $47_{11}$–$47_{53}$ at the timing established by using the drive signal DS driving the vibrator 32, such that the synchronized rectifiers $47_{11}$–$47_{53}$ produce focus signals which varies substantially in direct proportion to the focusing positions at the corresponding measurement points, as far as the focusing positions are within a predetermined range. In this embodiment, the calibration is made for the focus signals produced from the synchronized rectifiers $47_{11}$–$47_{53}$, such that the focus signals are at zero levels under the condition when the reticle 7 is positioned stationary at the midpoint in the scanning direction in FIG. 1 and when the corresponding measurement points are positioned in a image plane (the best focus plane) of the projection optical system 11.

The focus signals produced from the synchronized rectifiers $47_{11}$–$47_{53}$ are supplied to a multiplexor 48 in parallel. The multiplexor 48 operates in synchronism with a select signal from a microprocessor (MPU) 50 in the main control system 20, so as to sequentially select one of the supplied focus signals at a time and supply the selected focus signal to an analog-to-digital converter (A/D) 49. Thus, the A/D 49 sequentially outputs digital focus signals which are stored in a memory 51 in the main control system 20.

Figure 7A:
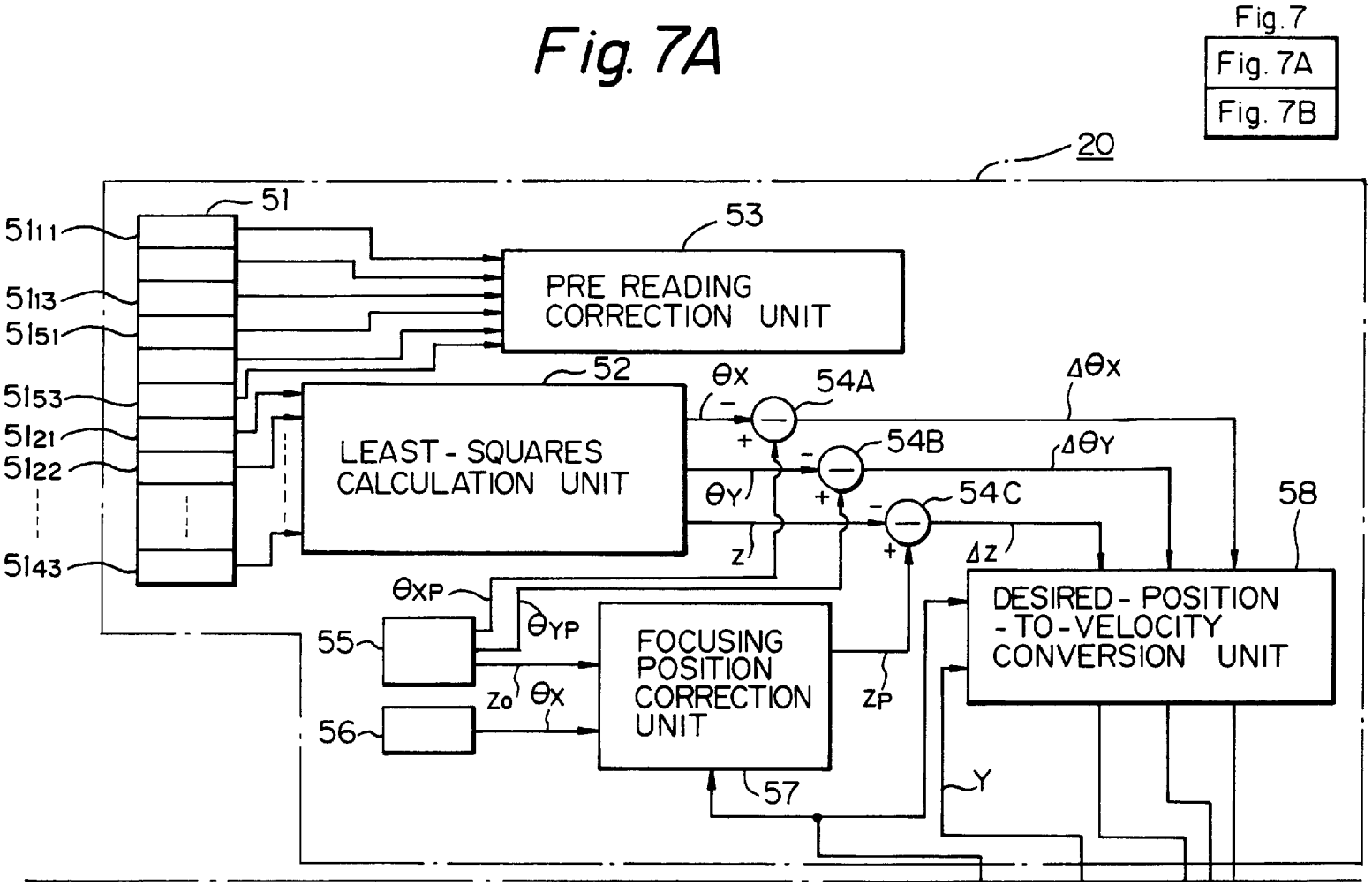
Figure 7B:
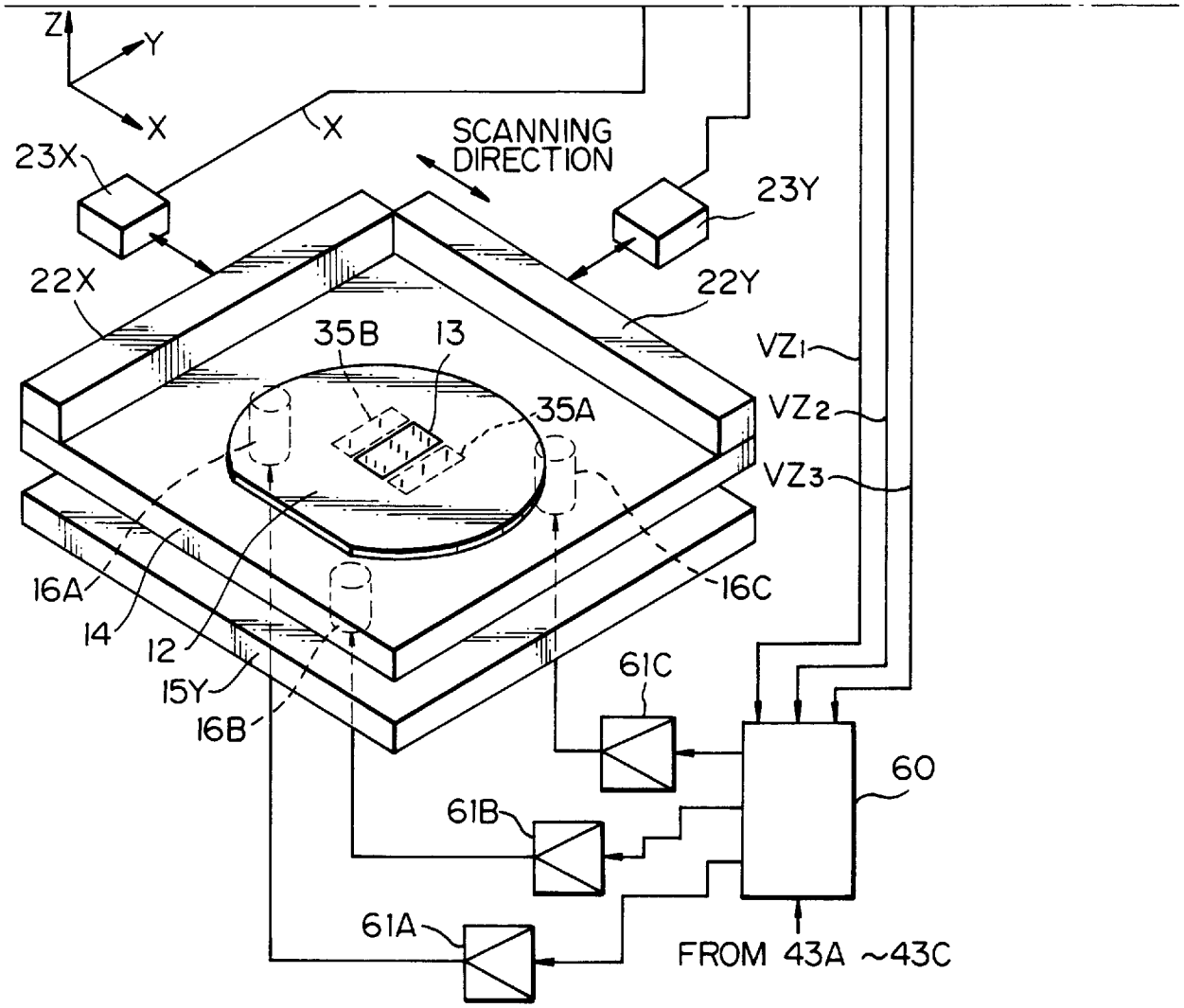

FIG. 7 shows a drive system for the three actuators 16–A16C. In the main control system 20 of FIG. 7, digital focus signals representing the focusing positions at the measurement points $P_{11}$–$P_{53}$ of FIG. 2 are stored at corresponding addresses $51_{11}$–$51_{53}$ in the memory 51. The focus signals stored in the memory 51 are periodically updated at a predetermined sampling frequency. Those of the focus signals which are stored at addresses corresponding to the measurement points confined in the illumination field 13 of FIG. 2 (i.e., at addresses $51_{21}$–$51_{43}$) are read out and supplied to a least-squares calculation unit 52 in parallel. The least-squares calculation unit 52 uses these nine focus signals corresponding to the nine measurement points $P_{21}$–$P_{43}$ confined in the illumination field 13, so as to determine a plane which is considered to be coincident with the surface of the wafer in the illumination field 13 according to the least-squares method. The least-squares calculation unit 52 further determines the focusing position (in terms of the Z-coordinate) z of the determined plane at the center thereof, the tilt angle $\theta_x$ of the determined plane about the Y-axis, and the tilt angle $\theta_y$ of the determined plane about the X-axis. The tilt angle $\theta_x$, the tilt angle $\theta_y$, and the focusing position z are supplied to the subtractors 54A, 54B and 54C, respectively.

On the other hand, those of the focus signals which are stored at addresses $51_{11}$–$51_{13}$ and $51_{51}$–$51_{53}$, i.e., the focus signals corresponding to the measurement points confined in the prereading areas 35A and 35B of FIG. 2, are read out and supplied to a prereading correction unit 53. The prereading correction unit 53 serves, among others, to detect any surface irregularities of the wafer 12.

The main control system 20 also includes a first storage unit 55 and a second storage unit 56. The first storage unit 55 stores data relating to a first reference plane which represents an image plane in the illumination field 18 on the wafer 12, including the tilt angle $\theta_{xp}$ of the first plane about the Y-axis, the tilt angle $\theta_{yp}$ of the first plane about the X-axis, and the focusing position $z_0$ of the image plane at the center of the illumination field 13 when the center of the reticle 7 is coincident with the optical axis of the projection optical system 11. On the other hand, the second storage unit 56 stores data relating to a second reference plane which represents a image plane extending the entire region of the exposure field (shot area) on the wafer 12, including the tilt angle $\Theta_x$ of the second reference plane about the Y-axis (i.e., the tilt angle thereof toward the scanning direction).

Figure 8A:
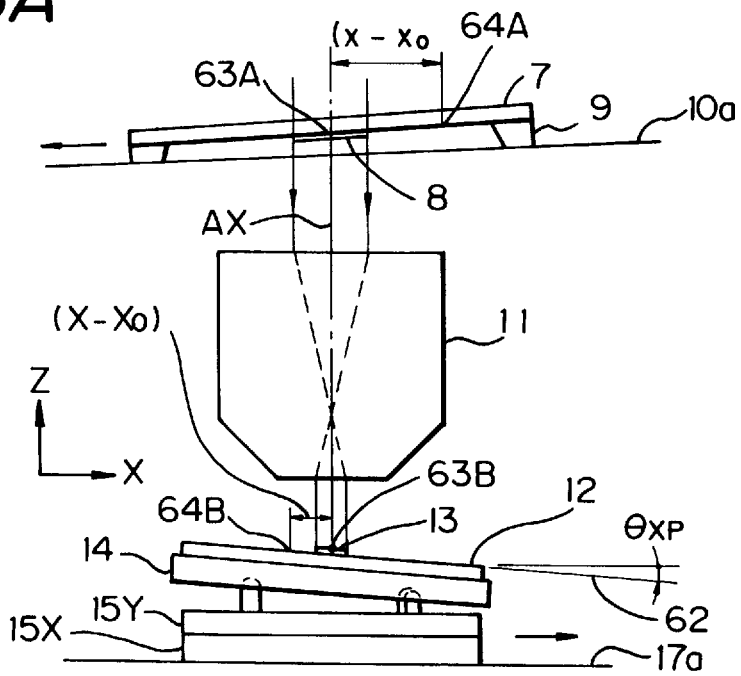
FIG. 8A is a schematic view illustrating the relationship between illumination field 13 on the wafer 12 and first reference plane 62.
Figure 8B:
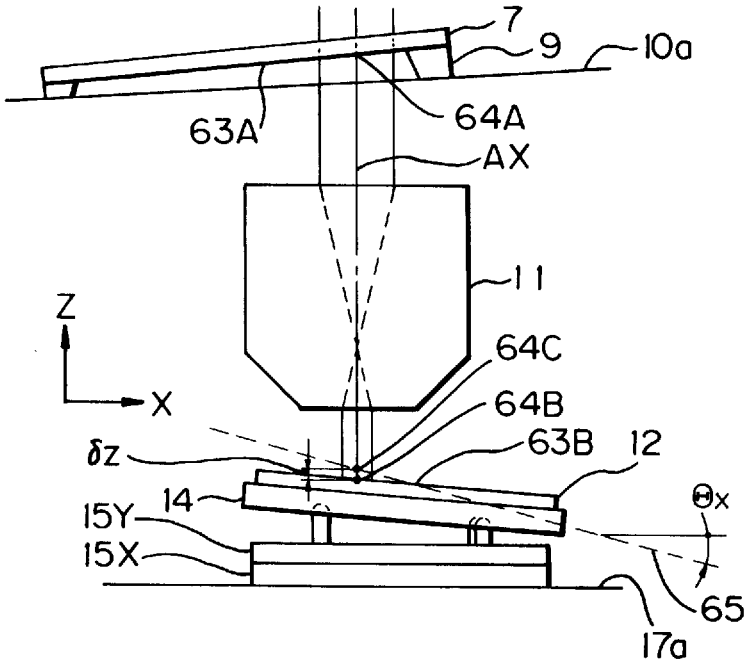
FIG. 8B is a schematic view illustrating the relationship between illumination field 13 on the wafer 12 and second reference plane 65.

Referring now to FIGS. 8A and 8B, the first and second reference planes will be described in more detail. FIG. 8A is a simplified schematic representation of the stage system of FIG. 1. In FIG. 8A, it is assumed that the reticle stage 9, which serves to move the reticle 7 in the X-direction for scanning, slides along a slide plane (guide plane) 10*a* while the pattern bearing surface of the reticle 7 has a certain inclination relative to the slide plane 10*a*. Also, it is assumed that the X-stage 15X, which serves to move the wafer 12 in the X-direction for scanning, slides along another slide plane 17*a* and the tilt angles of the slide plane 17*a* about Y- and X-axes have been adjusted to be (0, 0).

With these assumptions, the first reference plane 62 is defined as that image plane in which the portion of the pattern on the reticle 7 as confined in the illumination area 8 is formed when the reticle 7 is positioned at the midpoint in the scanning direction. The tilt angles $\theta_{xp}$ and $\theta_{yp}$ about the Y- and X-axes, respectively, of the first reference plane 62 relative to the slide plane 17*a,* as well as the focusing position $z_0$ of the first reference plane 62, are determined and stored as preparatory data. The surface of the wafer 12 is so positioned as to be coincident with the first reference plane 62, through the control of the displacements produced by the three actuators 16A–16C (see FIG. 7). However, the image plane of the actually formed image in the illumination field 13 moves in the Z-direction while keeping its orientation parallel to the first reference plane 62, when the reticle 7 is moved along the slide plane 17*a* in the X-direction so as to cause the illumination area 8 to move in the Z-direction. The second reference plane is defined to account for this displacement of the first reference plane 62 in the Z-direction.

It is assumed here that the wafer 12 is moved for scanning in the +X-direction. Then, the relationship between the focusing position $z_0$ when the wafer 12 is in the position shown in FIG. 8A and the focusing position $Z_A$ when the wafer 12 is in the position shown in FIG. 8B is approximately expressed as:

$$z_A=(X-X_0)\theta_{xp}+z_0 \qquad \text{(formula 1)}$$

To consider the influences of the movement of the reticle 7 for scanning, it is also assumed that the pattern bearing surface of the reticle 7 has a tilt relative to the slide plane (1O*a*) toward the scanning direction with a certain tilt angle. This results in that the position of the image plane at the center of the illumination field is displaced along the second reference plane 65 (which is the plane having a tilt angle toward the scanning direction (i.e., the tilt angle about the Y-axis) of $\Theta_x$) when the reticle 7 is moved in the X-direction for scanning, as shown in FIG. 8B.

More specifically, in FIG. 8A, the point 63A is a point on the pattern bearing surface of the reticle 7 and on the optical axis AX. The point 64A is a point on the pattern bearing surface of the reticle 7 and distant from the point 63A toward the +X-direction, and the distance between these points is expressed as $(x-x_0)$. The point 63B is an image point on the wafer 12 and conjugate to the point 63A. The point 64B is a point on the wafer 12 and distant from the point 63B toward −X-direction, and the distance between these points is expressed as $(X-X_0)$. The magnification ratio of the projection optical system 11 is designated by β (the value of β is ¼ or ⅕, for example). Then, the distances mentioned above satisfy the relationship expressed as:

$$X-X_0=-\beta\,(x-x_0) \quad \text{(formula 2)}$$

Since the tilt angle of the second reference plane 65 is $\Theta_x$ and the focusing position when the substrate 12 is in the position $X_0$ shown FIG. 8A is $z_0$, the focusing position at the center of the illumination field when the substrate 12 is in the position shown in FIG. 8B is the focusing position $z_B$ expressed by formula 3 below.

$$z_B=(X-X_0)\Theta_x z_0 \quad \text{(formula 3)}$$

Thereafter, while the tilt angle and the focusing position of the wafer 12 are kept locked, the reticle 7 and the wafer 12 are moved from the positions shown in FIG. 8 in the −X-direction and the +X-direction, respectively, with the ratio between their velocities being equal to β. Then, at the point of time when the point 64A on the reticle 7 reaches a point on the optical axis AX, the point 64B on the wafer 12 reaches a point on the optical axis AX. However, because the illumination area on the reticle 7 is displaced in the Z-direction, the image point 64C of the point 64A on the reticle 7 with respect to the projection optical system 11 is distant from the point 64B distance δz in the Z-direction. Here, in FIG. 8B, the second reference plane 65 is defined as the plane containing the former image point 63B and the new image point 64B on the wafer side and having its tilt angle about the X-axis equal to the tilt angle $\theta_{yp}$ of the first reference plane 62. Then, image points (with respect to the projection optical system 11) of the points on the reticle 7 and sequentially passing the optical axis AX when the reticle 7 and the wafer 12 are moved for scanning in the X-direction and +X-direction, respectively, will form a line which lies in the second reference plane 65. In other words, the second reference plane is the image plane of the image of the pattern on the reticle which is projected in the exposure field (shot area) on the wafer 12.

In this embodiment, the tilt angle $\Theta_x$ of the second reference plane 56 about the Y-axis is determined and stored as preparatory data. Then, the distance δz between the point 64B on the wafer 12 and the image point 64 shown in FIG. 8B is expressed using the tilt angle $\Theta_{xp}$ of the first reference plane 62 and the tilt angle $\Theta_x$ of the second reference plane 65 as:

$$\delta z=z_B-z_A=(X-X_0)(\Theta_x-\theta_{xp}) \quad \text{(formula 4)}$$

Accordingly, the focusing (auto-focusing) may be achieved by causing the levels (heights) of the acting points of the three actuators 16A∝16C to displace in parallel, by the displacements equal to the distance δz. The levelling has been already achieved at this point time.

Referring again to FIG. 7, the first storage unit 55 supplies the tilt angles $\theta_{xp}$ and $\theta_{yp}$ of the first reference plane to the subtractors 54A and 54B, respectively, which are used as the desired tilt angles. The subtractors 54A and 54B output the errors in the tilt angles $\Delta\theta_x$ ($=\theta_{xp}-\theta_x$) and $\Delta\theta_y$ ($=\theta_{yp}-\theta_y$), respectively, which are supplied to the desired-position-to-velocity conversion unit 58. Further, the first storage unit 55 supplies the tilt angle $\theta_{xp}$ and the focusing position $z_0$ of the image plane under the reference condition to a focusing position correction unit 57, and the second storage unit 56 supplies the tilt angle $\Theta_x$ of the second reference plane to the focusing position correction unit 57. In addition, the X-coordinate of the Z/tilt-stage 14 (hence of the wafer 12) measured by means of the X-axis laser interferometer 23X is supplied to both the focusing position correction unit 57 and the desired-position-to-velocity conversion unit 58, and the Y-coordinate of the Z/tilt-stage 14 measured by means of the Y-axis laser interferometer 23Y is supplied to the desired-position-to-velocity conversion unit 58.

The focusing position correction unit 57 calculates the shift δz (see FIG. 8B) in the focusing position by substituting the X-coordinate of the Z/tilt-stage 14 under the reference condition and the current X-coordinate of the Z/tilt-stage 14 for $X_o$ and X, respectively, in formula 4, sums up the shift δz and the focusing position $z_0$ to obtain the desired focusing position $z_p$, and supplies the desired focusing position $z_p$ to the subtractor 54C. The subtractor 54C, in response thereto, supplies the desired-position-to-velocity conversion unit 58 with the error Δz ($=z_p-z$) in the focusing position.

The desired-position-to-velocity conversion unit 58 uses the supplied X- and Y-coordinates of the Z/tilt-stage 14 to calculate three sets of coordinates ($X_1$, $Y_1$), ($X_2$, $Y_x$) and ($X_3$, $Y_3$) of the acting points of the three actuators 16A, 16B and 16C, respectively, taking the position of the optical axis of the projection optical system 11 as the origin of the coordinates. Further, the desired-position-to-velocity conversion unit 58 has been provided with and stores as preparatory data, the loop gains $K\theta_x$, $K\theta_y$ and Kz of respective position control systems for the tilt angle $\theta_x$, the tilt angle $\theta_y$ and the focusing position z. The desired-position-to-velocity conversion unit 58 calculates velocity command values $VZ_1$, $VZ_2$ and $VZ_3$ for the three actuators 16A, 16B and 16C, respectively, using the following formula:

$$\begin{bmatrix} VZ_1 \\ VZ_2 \\ VZ_3 \end{bmatrix} = \begin{bmatrix} K\theta_x & 0 & 0 \\ 0 & K\theta_y & 0 \\ 0 & 0 & Kz \end{bmatrix} \begin{bmatrix} X_1 & Y_1 & 1 \\ X_2 & Y_2 & 1 \\ X_3 & Y_3 & 1 \end{bmatrix} \begin{bmatrix} \Delta\theta_x \\ \Delta\theta_y \\ \Delta z \end{bmatrix} \quad \text{(formula 5)}$$

The XY-coordinates ($X_1$, $Y_1$), ($X_2$, $Y_2$) and ($X_3$, $Y_3$) of the acting points of the actuators 16A, 16B and 16C vary as the wafer 12 is moved for scanning. Therefore, the desired-position-to-velocity conversion unit 58 performs the arithmetic operations of formula 5 repetitively, that is, every time the wafer 12 being moved for scanning has covered an additional predetermined step of distance, or at ceratin constant time intervals, to calculate the velocity command values $VZ_1$, $VZ_2$ and $VZ_3$. The velocity command values $VZ_1$, $VZ_2$ and $VZ_3$ are supplied to a velocity controller 60, which drives the actuators 16A–16C by means of respective power amplifiers 61A–61C. Further, the velocity detection signals from the rotary encoders 43A–43C (such as the rotary encoder 43 shown in FIG. 6) are fed back to the velocity controller 60. In this manner, the actuators 16A–16C are driven to move their acting points in the Z-direction at velocities specified by the velocity command values $VZ_1$–$VZ_3$, respectively.

Then, the position and the tilt angles of the surface of the wafer 12 after driven by the actuators 16A–16C are determined by means of the multipoint AF sensor 25 of FIG. 1 and the least-squares calculation unit 52 of FIG. 7, and the deviations (errors) of the determination results from the respective desired values are fed back to the desired-position-to-velocity conversion unit 58. Because the tilt angles and the focusing position of the Z/tilt-stage 14 are servo-controlled during the scanning exposure operation in this way, it is ensured that the exposure operation is carried out with the illumination field 13 on the wafer 12 being always coincident with the image plane in which formed is a projected image of that portion of the pattern on the reticle 7 which is then confined in the illumination area 8.

Next, an exemplified method of measuring i) the tilt angles $\theta_{xp}$ and $\theta_{yp}$ of the first reference plane 62 corresponding to the image plane in the illumination field 13 and ii) the tilt angle $\Theta_x$ of the second reference plane 65 corresponding to the image plane of the exposure field on the wafer 12, as shown in FIGS. 8A and 8B.

First, with respect to the first reference plane 62, the reticle 7 is positioned stationary at the midpoint in the scanning direction as shown FIG. 8A. Then, test printing (exposure for determining conditions) is carried out using step-and-repeat technique, in which the wafer stage is driven to step in both X- and Y-directions and the image of the pattern in the illumination area 8 is repetitively printed onto a plurality of regions (the regions to be exposed in the illumination field 13) on a wafer 12, when the surface of the wafer 12 is maintained parallel to the slide surface 17*a,* i.e., the pair of tilt angles are set to (0, 0), while the focusing position (the Z-coordinate) of the wafer 12 is gradually varied. Then, the wafer 12 is developed, and the developed, printed images are examined for their resolutions, so that the distribution of the best focus positions at different points in the illumination field 13 is determined. Then, the distribution is approximated by a plane, so as to determine the tilt angles ($\theta_{xp}$, $\theta_{yp}$) and the focusing position $z_0$ of the first reference plane 62.

Second, with respect to the second reference plane 65, the tilt angles ($\theta_{xp}$, $\theta_{xp}$) of the first reference plane 62 as determined in the manner described above are utilized. For this purpose, those of the data in the first storage unit 55 of FIG. 5 which represent the tilt angles ($\theta_{xp}$, $\theta_{yp}$) are set to the determined values through an input/output device (not shown). Further, the data in the second storage unit 56 representing the tilt angle $\Theta_x$ of the second reference plane 65 is set to "0" (this value corresponds to the tilt angle of the slide plane 17*a*) through the input/output device. Then, test printing is carried out using step-and-scan technique, in which exposures are performed at a plurality of points on the wafer while the desired value of the focusing position (the Z-coordinate) is incremented by a predetermined step after each exposure. In each of the scanning exposure operations for the test printing, the wafer 12 is set to have the same tilt angles as the first reference plane 62 and a fixed focusing position. Then, the wafer 12 is developed, and the developed, printed images are examined for their resolutions, so that the distribution of the best focus positions in each exposure field (shot area) on the wafer 12 is determined. From this distribution, the tilt angle $\Theta_x$ of the second reference plane 65 about the Y-axis and the tilt angle $\Theta_y$ of the second reference plane 65 about the X-axis (this is substantially equal to the tilt angle $\theta_{yp}$ of the first reference plane 62) are determined. That is, the tilt angles of the second reference plane 65 are indicative of the distribution of the best focus positions in the exposure field. The tilt angle $\Theta_x$ about the Y-axis is stored in the second storage unit 56 of FIG. 7 through the input/output device (not shown).

In FIG. 2, the measurement points $P_{21}$–$P_{43}$ for determining the tilt angles and the focusing position are distributed within the illumination field 13. However, they may be distributed beyond the border of the illumination field 13. Further, the total number and the arrangement of the entire set of the measurement points $P_{11}$–$P_{53}$ are not limited to those shown in FIG. 2. For example, the measurement points may be arranged in an array comprising rows staggered in the X-direction.

Further, in the embodiment described above, the tilt angles of the illumination field 13 on the wafer 12 are determined by using the multipoint AF sensor 25. Alternatively, they may be determined by using a levelling sensor of the type utilizing an obliquely incident collimated beam, in which a single-point AF sensor is used in place of the multipoint AF sensor, a collimated beam is illuminated obliquely onto the surface of the wafer 12, and the lateral shift of the reflecting beam is used so as to determine the tilt angles of the surface.

According to a projection exposure apparatus of the present invention, such kind of tilt angles of the projected image relative to the exposure area (illumination field) on the photosensitized substrate which may be caused by the inclination of the mask and/or the projection optical system, are represented by the tilt angles of the first reference plane. On the other hand, such kind of tilt angles of the projected image relative to the exposure field on the substrate which may be caused by the difference between the tilt angles of the slide planes (guide planes) of the mask stage and the substrate stage, are represented by the tilt angles of the second reference plane. As the result, by controlling the tilt angles and the focusing position based on these two reference planes, there is provided an advantage that the surface of the substrate may be dynamically adjusted to be coincident with the image plane with a high tracking accuracy during the scanning exposure operation, even when the height of the image plane of the projection optical system varies during the scanning exposure operation.

As the result, highly uniform, projected images may be obtained with ease over the entire region of each exposure field (shot area) on the substrate. Further, good imaging characteristics may be maintained even when the focal depth in the image plane of the projection optical system is relatively shallow. That is, a larger focus margin may be obtained for a given focal depth.

Further, in the case where the tilt angles of the first reference plane and the tilt angles of the second reference plane (indicative of the variation in the focusing position) have been determined and stored as preparatory data, the scanning exposure operation may be carried out by using the stored data, so that the control sequence may be simplified and higher tracking speeds for following the variation in the focusing position may be obtained.

In the following, an exemplified focusing position detection method, which is effective in reducing the settling time and enhancing the throughput, will be described.

Figure 10A:
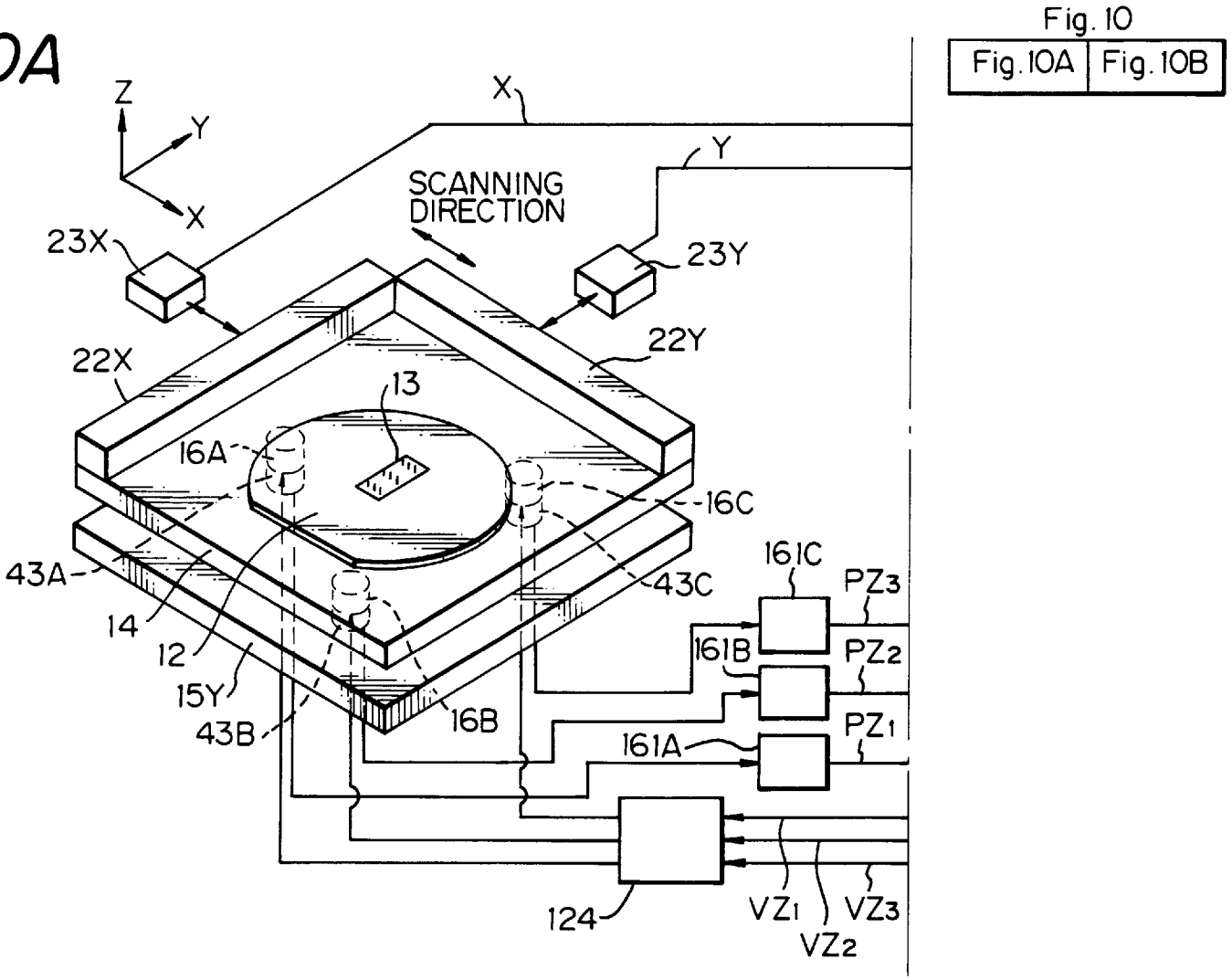
Figure 10B:
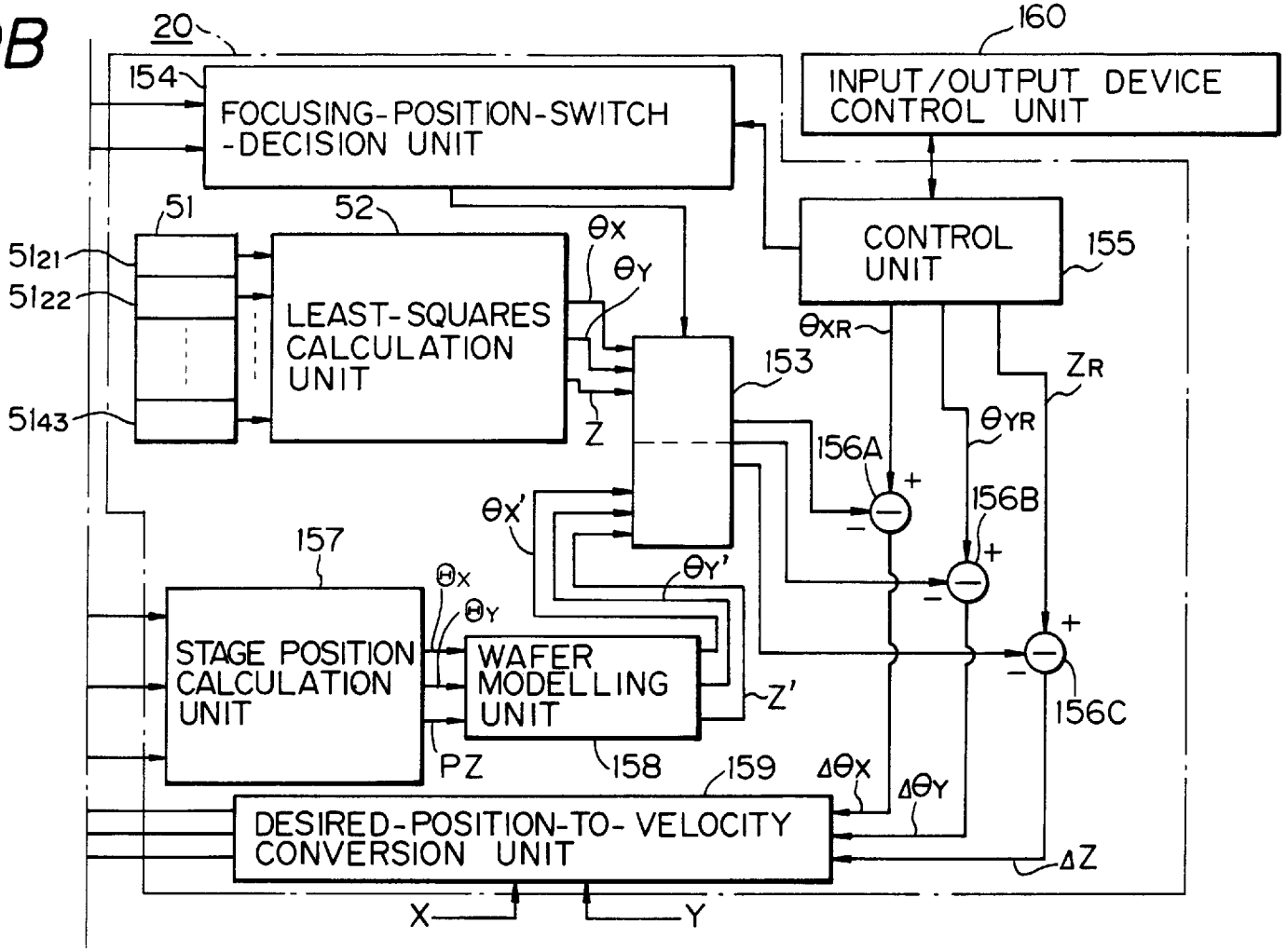

FIG. 10 shows a drive system for the three actuators 16A–16C of FIG. 1. In this exemplified arrangement, pulse signals from the rotary encoder 43 are counted up by a counter 161A so as to determine the Z-direction position (height) $PZ_1$ of the acting point of the actuator 16A to the Z/tilt-stage 14.

As shown in FIG. 10, the other two actuators 16B and 16C have the same arrangement as the actuator 16A and thus are provided with respective rotary encoders 43B and 43C, through which displacement velocities of their actuation points may be determined. There are also provided counters 161B and 161C for counting up the pulse signals from the rotary encoders 43B and 43C, respectively. The counters 161B and 161C are used to determine the Z-direction positions $PZ_2$ and $PZ_3$ of the acting points of the actuators 16B and 16C to the Z/tilt-stage 14.

In the main control system 20 of FIG. 10, digital focus signals representing the focusing positions at the measurement points $P_{21}$–$P_{43}$ in the illumination field 13 of FIG. 2 are stored at corresponding addresses $\mathbf{51}_{21}$–$\mathbf{51}_{43}$ in a memory 51.

The focus signals stored in the memory 51 are periodically updated at a predetermined sampling frequency. The focus signals are read out from the corresponding addresses $51_{21}$–$51_{43}$ and supplied to a least-squares calculation unit 52 in parallel. The least-squares calculation unit 52 uses these nine focus signals corresponding to the nine measurement points $P_{21}$–$P_{43}$ in the illumination field 13 so as to determine a plane which is considered to be coincident with the surface of the illumination field 13 according to the least-squares method. The least-squares calculation unit 52 further determines the focusing position (in terms of the Z-coordinate) z of the determined plane at the center thereof, the tilt angle $\theta_x$ of the determined plane about the Y-axis, and the tilt angle $\theta_y$ of the determined plane about the X-axis. The tilt angle $\theta_x$, the tilt angle $\theta_y$, and the focusing position z are supplied to one of the two sets of inputs of a multiplexor 153.

On the other hand, the Z-direction positions $PZ_1$, $PZ_2$ and $PZ_3$ of the acting points of the actuators 16A, 16B and 16C produced from the corresponding counters 161A, 161B and 161C are supplied to a stage position calculation unit 157 in the main control system 20. The stage position calculation unit 157 is also supplied with X- and Y-coordinates of the Z/tilt-stage (hence of the wafer 12) measured by means of the laser interferometers 23X and 23Y, respectively. The stage position calculation unit 157 calculates three sets of coordinates $(X_1, Y_1)$, $(X_2, Y_2)$ and $(X_3, Y_3)$ of the acting points of the three actuators 16A, 16B and 16C, respectively, in the coordinate system which specifies the X- and Y-coordinates taking the position of the optical axis of the projection optical system 11 as the origin thereof.

Figure 9:
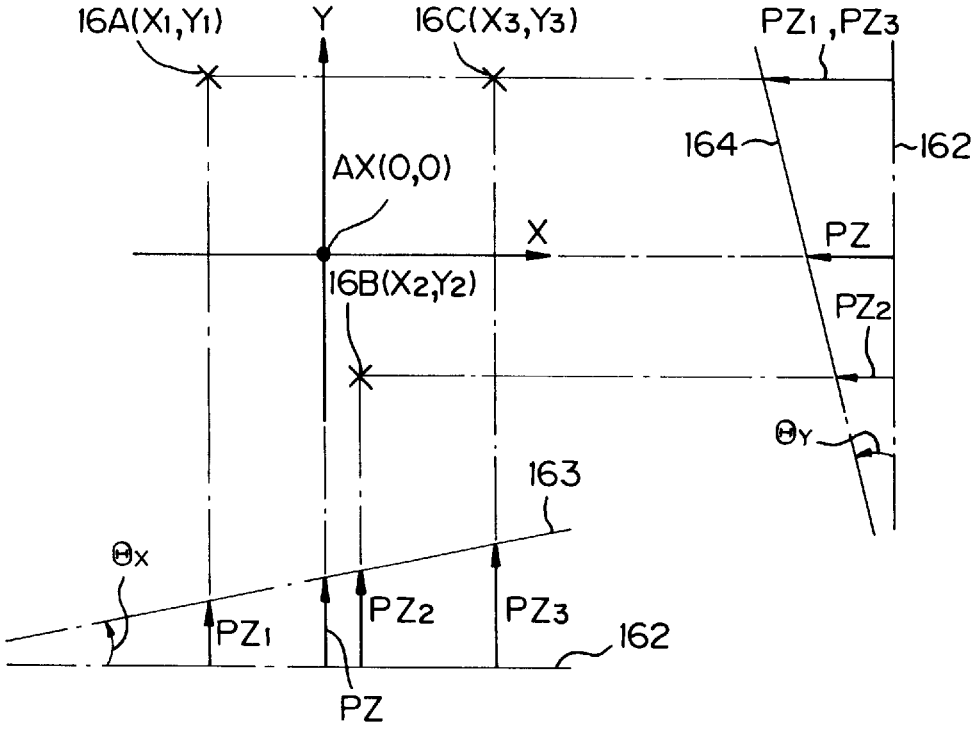
FIG. 9 is a chart illustrating the tilt angles and the heights of the plane defined by three actuators 16–A16C.

FIG. 9 shows the coordinate system taking the position of the optical axis AX of the projection optical system 11 as the origin (0, 0). In FIG. 9, guide plane 162 represents the guide plane (slide plane) along which the X-stage 15X and the Y-stage are moved. Line 163 represents the intersection between i) a plane defined by the three acting points of the three actuators 16A–16C to the Z/tilt-stage 14 and ii) a plane in which the origin lies, through which the X-axis extends and to which the X-axis is perpendicular. Similarly, line 164 represents the intersection between i) the plane defined by the three acting points of the three actuators 16A–16C to the Z/tilt-stage 14 and ii) a plane in which the origin lies, through which the Y-axis extends and to which the Y-axis is perpendicular. The angle $\Theta_x$ formed between the line 163 and the guide plane 162 and the angle $\Theta_y$ formed between the line 164 and the guide plane 162 represent the tilt angles of the bottom surface the Z/tilt-stage 14 relative to the guide plane 162. The amount of defocusing of the bottom surface of the Z/tilt-stage 14 along the optical axis AX passing through the origin, which is referred to as the amount of defocusing at the origin and designated by PZ, is equal to the distance from the guide plane 162 to the lines 163 and 164. It is noted that FIG. 9 shows the Z-direction positions $PZ_1$, $PZ_2$ and $PZ_3$ between the line 163 and the guide plane 162 as well as between the line 164 and the guide plane 162; however, these Z-direction positions shown are not proportional to the actual values but are scaled into the values on the on the X-axis and Y-axis, respectively. Further, the Z-direction positions $Pz_1$, $PZ_2$ and $PZ_3$ are calibrated taking the guide plane 162 as the reference, and the focusing position z and the tilt angles $\theta_x$ and $\theta_y$ calculated by the least-square calculation unit 52 are also calibrated taking the guide plane 162 as the reference.

The stage position calculation unit 157 substitute the coordinates $(X_1, Y_1)$, $(X_2, Y_2)$ and $(X_3, Y_3)$ and the Z-direction positions $PZ_1$, $PZ_2$ and $PZ_3$ of the three acting points of the three actuators 16A, 16B and 16C into the following formula 6, so as to determine the tilt angles $\Theta_x$ and $\Theta_y$ and the focusing position PZ of the bottom surface of the Z/tilt-stage 14.

$$\begin{bmatrix} \Theta_1 \\ \Theta_2 \\ PZ \end{bmatrix} = \begin{bmatrix} X_1 & Y_1 & 1 \\ X_2 & Y_2 & 1 \\ X_3 & Y_3 & 1 \end{bmatrix}^{-1} \begin{bmatrix} PZ_1 \\ PZ_2 \\ PZ_3 \end{bmatrix} \quad \text{(formula 6)}$$

Referring again to FIG. 10, the determined values of the tilt angles $\Theta_x$ and $\Theta_y$ and the focusing position PZ are supplied to a wafer modelling unit 158. The wafer modelling unit 158 is also supplied with the data representing the X- and Y-coordinates of the Z/tilt-stage 14. The wafer modelling unit 158, using the supplied values (i.e., the tilt angles $\Theta_x$ and $\Theta_y$ and the focusing position PZ of the bottom surface of the Z/tilt-stage 14 and the current coordinates (X, Y) of the Z/tilt-stage 14) and the wafer model already obtained, determines the values of parameters of a hypothetical surface of the wafer 12, i.e., the tilt angle $\theta_{x'}$ about the Y-axis, the tilt angle $\theta_{y'}$ about the X-axis and the focusing position z' of the hypothetical surface of the wafer 12. The determined values of these parameters are supplied to the other set of inputs of the multiplexor 153.

That is, in this arrangement, the multiplexor 153 receives on the one hand the tilt angles and the focusing position obtained by actually measuring the surface of the wafer 12 and on the other hand the tilt angles and the focusing position of the hypothetical surface of the wafer 12. Thus, in this arrangement, the focusing and levelling control may be performed while switching the control mode between the direct control mode (based on the actually measured values of the surface of the wafer 12) and the model tracking control mode (based on the parameters of the hypothetical surface of the wafer 12). The timing to make a switch between these two control modes may be indicated by the instructions which the operator inputs through an input/output device 160 into a control unit 155 in the main control system 20. The instructions may specify the control mode to be used for particular ranges of coordinates (X, Y) of the Z/tilt-stage 14, and are supplied to a focusing-position-switch-decision unit 154.

The focusing-position-switch-decision unit 154 also receives the X- and Y-coordinates of the Z/tilt-stage 14. The focusing-position-switch-decision unit 154, in response to the received coordinates, supplies the multiplexor 153 with a control signal instructing to select one of the control modes. When instructed to perform the direct control based on the actually measured values of the surface of the wafer 12, the multiplexor 153 selects the tilt angles $\theta_x$ and $\theta_y$ and the focusing position z to be supplied to the subtractors 156A, 156C and 156C, respectively. On the other hand, when instructed to perform the model tracking control based on the values of the parameters of the hypothetical surface of the wafer 12, the multiplexor 153 selects the tilt angles $\theta_{x'}$ and $\theta_{y'}$ and the focusing position z' to be supplied to the subtractors 156A, 156C and 156C, respectively.

In addition, there have been determined as preparatory data, through an appropriate process such as a test printing, the values of parameters of the image plane of the projection optical system 11, i.e., the tilt angle $\theta_{x0}$ about the Y-axis, the tilt angle $\theta_{y0}$ about the X-axis and the focusing position $z_0$ of that image plane, all referenced to the guide plane 162 (see FIG. 9) of the wafer stage and under the condition that the coordinates of the Z/tilt-stage 14 are equal to a predetermined reference coordinates $(X_0, Y_0)$. The determined values of the tilt angle $\theta_{x0}$,the tilt angle $\theta_{y0}$, and the focusing position $z_0$ are stored in a storage unit provided in the control unit 155. When the coordinates of the Z/tilt-stage 14 has stepped to any new coordinates (X, Y), the control unit 155 calculates new values of the three parameters of the image plane, i.e., the tilt angles $\theta_{xR}$ and $\theta_{yR}$ and the focusing position $z_R$ of the image plane referenced to the guide plane 162, using the following approximate formulae:

$$\theta_{xR}=\theta_{xo},$$

$$\theta_{yR}=\theta_{yo},$$

$$z_R=(X-X_0)\theta_{xo}+(Y-Y_0)\theta_{yo}+z_0 \quad \text{(formula 7)}$$

The determined values of the tilt angles $\theta_{xR}$ and $\theta_{yR}$ and the focusing position $z_R$ of the image plane are supplied to the subtractors 156A, 156B and 156C, respectively, to be used as the desired values. The subtractors 156A, 156B and 156C supplies to the desired-position-to-velocity conversion unit 159 with the errors $\Delta\theta_x$ and $\Delta\theta_y$ in the tilt angles relative to their corresponding desired values and the error $\Delta z$ in the focusing position relative to its corresponding desired value. For example, the error $\Delta\theta_x$ in the tilt angle about the Y-axis is determined as either $(\theta_{xR}-\theta_x)$ or $(\theta_{xR}-\theta_{x'})$. The desired-position-to-velocity conversion unit 159 also receives the X- and Y-coordinates of the Z/tilt-stage 14 (hence of the wafer 12).

The desired-position-to-velocity conversion unit 159 uses the supplied X- and Y-coordinates of the Z/tilt-stage 14 to calculate three sets of coordinates $(X_1, Y_1)$, $(X_2, Y_2)$ and $(X_3, Y_3)$ of the acting points of the three actuators 16A, 16B and 16C, respectively, taking the position of the optical axis of the projection optical system 11 as the origin of the coordinates. Further, the desired-position-to-velocity conversion unit 159 has been provided with and stores as preparatory data, the loop gains $K\theta_x$, $K\theta_y$ and Kz of respective position control systems for the errors $\Delta\theta_x$ and $\Delta\theta_y$ in the tilt angles and the error $\Delta z$ in the focusing position. The desired-position-to-velocity conversion unit 159 performs arithmetic operations repetitively, that is, every time the wafer 12 being moved for scanning has covered an additional predetermined distance, or at ceratin constant time intervals, to calculate the velocity command values $VZ_1$, $VZ_2$ and $VZ_3$ for the three actuators 16A, 16B and 16C, respectively, using the following formula:

$$\begin{bmatrix} VZ_1 \\ VZ_2 \\ VZ_3 \end{bmatrix} = \begin{bmatrix} K\theta_x & 0 & 0 \\ 0 & K\theta_y & 0 \\ 0 & 0 & Kz \end{bmatrix} \begin{bmatrix} X_1 & Y_1 & 1 \\ X_2 & Y_2 & 1 \\ X_3 & Y_3 & 1 \end{bmatrix} \begin{bmatrix} \Delta\theta_x \\ \theta_y \\ \theta z \end{bmatrix} \quad \text{(formula 5)}$$

The velocity command values $VZ_1$, $VZ_2$ and $VZ_3$ thus calculated are supplied to the wafer stage control system 124 which, in turn, drives the actuators 16A, 16B and 16C by using a velocity-servo-control technique, such that the acting points of the actuators are caused to move at velocities corresponding to the velocity command values $Vz_1$, $VZ_2$ and $VZ_3$, respectively. In this manner, the focusing and levelling control of that portion of the surface of the wafer 12 which is confined in the illumination field 13 is achieved.

Through this control, the Z/tilt-stage 14 is driven by the three actuators 16A–16C, and thereby the Z-direction positions $PZ_1$, $PZ_2$ and $PZ_3$ of the three acting points of the actuators 16A–16C to the bottom surface of the Z/tilt-stage 14 are varied to new Z-direction positions, from which the stage position calculation unit 157 and the wafer modelling unit 158 determine new tilt angles and focusing position of the hypothetical surface of the wafer. At the same time, the multipoint AF sensor 25 of FIG. 1 and the least-squares calculation unit 52 of FIG. 10 measure new tilt angles and focusing position of the surface of the wafer 12. Then, either the deviations (errors) of the measurement results from the corresponding desired values or the deviations (errors) of the determined tilt angles and focusing position of the hypothetical surface from the corresponding desired values are fed back to the desired-position-to-velocity conversion unit 159. In this manner, the auto-focusing and the auto-leveling are achieved.

Figure 14:
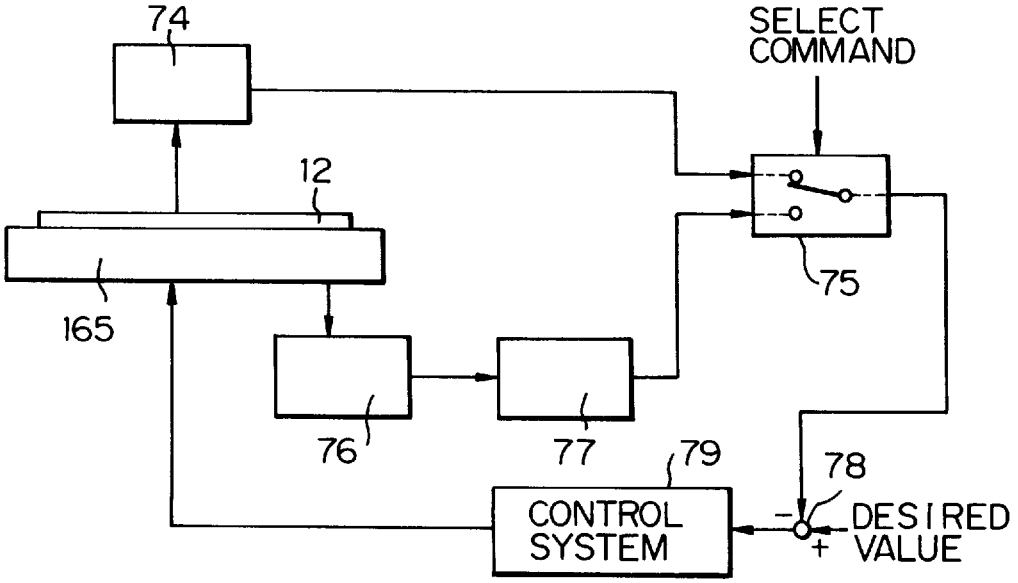
FIG. 14 is a simplified block diagram showing the basic arrangement of the projection exposure apparatus illustrated by FIGS. 1 and 10.

FIG. 14 shows a simplified block diagram showing the general arrangement of the exemplified control mechanism for the projection exposure apparatus shown in FIGS. 1 and 10. As shown in FIG. 14, a wafer 12 is held on a wafer stage 165, the tilt angles and the focusing position of the surface of the wafer 12 are measured by a sensor 74 (corresponding to the sensor 25 of FIG. 74), and the measured values are supplied to one of two inputs of a selector unit 75 (corresponding to the multiplexor 153 of FIG. 10). In addition, the tilt angles and the focusing position of a predetermined member relative to a predetermined reference plane are measured by a sensor 76 (corresponding to the encoder 43 of FIG. 10). The measured values are processed by a wafer modelling unit 77 (corresponding to the wafer modelling unit 158 of FIG. 10) into the estimated values representing the tilt angles and the focusing position of the hypothetical surface of the wafer 12. The estimated values are supplied to the other input of the selector unit 75. The selector unit 75, in response to an external select command, selects either the measured values or the estimated values to be supplied to a subtractor unit 78 (corresponding to the subtractors 156A–156C of FIG. 1). It is noted that in FIG. 14, the wafer stage 165 represents the stage system (comprising the Z/tilt-stage 14, the Y-stage 15Y and the X-stage 15X) on which the wafer 12 is held. The wafer stage 165 is referred to in the following description as well.

The subtractor unit 78 serves to subtract either the measured values or the estimated values from the externally supplied desired values to derive the corresponding errors, which are supplied to a control system 79 (corresponding to the combination of the wafer stage control system 124 and the desired-position-to-velocity conversion unit 159). Then, the control system 79 controls the tilt angles and the focusing position of the wafer stage 165 such that the errors may be reduced to zeros.

In the following, an exemplified control sequence for the focusing and levelling control will be described, in which the control mode is switched between the direct control mode based on the actually measured values of the parameters of the surface of the wafer 12 and the model tracking control mode based on the parameters of the hypothetical surface of the wafer 12.

Primarily, a switch between the two control modes occurs under one of three condition: i) the detection area of the multipoint AF sensor 25 is exiting the region defined by the surface of a wafer; ii) the detection area of the multipoint AF sensor 25 is entering the region defined by the surface of a wafer; and iii) the detection area of the multipoint AF sensor 25 is passing across such a region on the surface of a wafer that includes a groove-like structure which is inconvenient for the focusing and leveling control. In the following, these conditions are individually described.

Figure 11A:
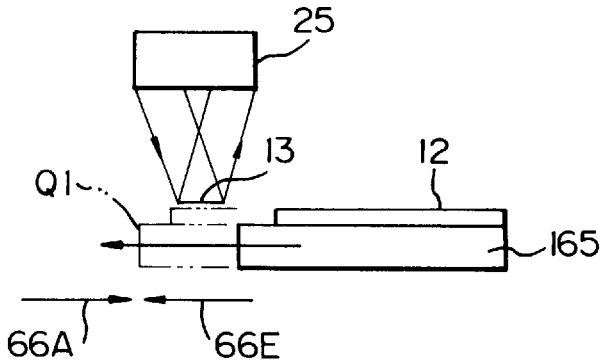
FIG. 11A is a schematic representation illustrating the detection area of multipoint AF sensor 25 entering a region on the wafer 12.

First, referring to FIG. 11A, the condition is described in which the detection area of the multipoint AF sensor 25, or the illumination field 13, is entering the region defined by the surface of the wafer 12, which may occur when the wafer is stepped or scanned. When the leading edge of the wafer stage 165 is moved within area 66E, the detection area of the multipoint AF sensor 25 falls outside the region defined by the surface of the wafer 12. Therefore, the multiplexor 153 of FIG. 10 is set to select the tilt angles $\theta_{x'}$ and $\theta_{y'}$ and the focusing position z' of the hypothetical surface supplied from the wafer modelling unit 158.

In the wafer modelling unit 158 of FIG. 10 the focusing position z' is derived by summing up the values of the Z-direction position PZ of the bottom surface of the Z/tilt-stage 14, the thickness of the Z/tilt-stage 14, the thickness of the wafer holder (not shown) and the thickness of the wafer 12, and the values of the tilt angles $\theta_{x'}$ and $\theta_{y'}$ are set to be equal to the values of the tilt angles $\Theta_x$ and $\Theta_y$ of the bottom surface of the Z/tilt-stage 14. As the result, the focusing and leveling control is performed such that the surface of the wafer 12 may remain coincident with the hypothetical surface. Then, the tilt angles $\theta_{x'}$ and $\theta_{y'}$ and the focusing position z' of the hypothetical surface of the wafer 12 are updated by means of the stage position calculation unit 157 and the wafer modelling unit 158 based on the Z-direction positions $PZ_1$–$PZ_3$ of the three points on the bottom surface of the Z/tilt-stage 14 after driven by the actuators 16A–16C. The deviations (errors) of the updated values from the corresponding desired values are supplied to the desired-position-to-velocity conversion unit 159 to be used as new servo-errors, so that a so-called closed-loop position-servo-control is performed.

Thereafter the wafer stage 165 continues to be moved as shown in FIG. 11A, and when the wafer stage 165 enters area 66A and this entrance is detected by the focusing-position-switch-decision unit 154 of FIG. 10, the multiplexor 153 is switched to select the tilt angles $\theta_x$ and $\theta_y$ and the focusing position z supplied from the least-squares calculation unit 52. The multiplexor 153 is so switched because at this time of point the entire detection area (illumination field 13) of the multipoint AF sensor 25 has been moved on the wafer 12 as shown by the position Q1, and thereby the actually measured values have become effective. Then, the Z/tilt-stage 14 is servo-controlled such that the tilt angles $\theta_x$ and $\theta_y$ and the focusing position z of the actual surface of the wafer 12 may become and remain equal to the corresponding desired values $\theta_{xR}$, $\theta_{yR}$ and $z_R$. When this switch occurs, the value of the focusing position of the surface of the wafer 12 is near the desired value by virtue of the control performed so far using the hypothetical surface of the wafer 12, so that the initial adjustment time (settling time), which is the time from the start of the new control mode to the point time when the surface of the wafer 12 become coincident with the image plane represented by the desired values, within only an allowable error, is reduced over any of conventional control techniques.

Figure 11B:
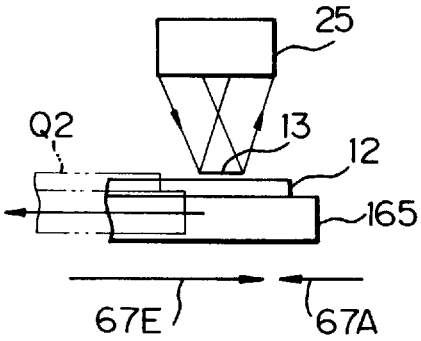
FIG. 11B is a schematic representation illustrating the detection area of multipoint AF sensor 25 exiting a region on the wafer 12.

Second, referring to FIG. 11B, the condition is described in which the detection area of the multipoint AF sensor 25 (the illumination field 13) is exiting the region defined by the surface of the wafer 12, which may occur when wafer is stepped or scanned. During the time when the trailing edge of the wafer stage 165 is moved within area 67A, the multiplexor 153 of FIG. 10 is set to select the tilt angles $\theta_x$ and $\theta_y$ and the focusing position z supplied from the least-squares calculation unit 52, so that the servo-control is performed such that the actual surface of the wafer 12 may remain coincident with the image plane. Thereafter, when the trailing edge of the wafer stage 165 enters area 67E and this entrance is detected by the focusing-position-switch-decision unit 154, the multiplexor 153 is switched to select the values supplied from the wafer modelling unit 158, so that the servo-control is performed such that the hypothetical surface of the wafer defined by the wafer model may become and remain coincident with the image plane. The control mode is so switched because significant variations occur in the measured values produced from the multipoint AF sensor 25 when the detection area of the multipoint AF sensor 25 exits the region defined by the surface of the wafer 12.

Figure 11C:
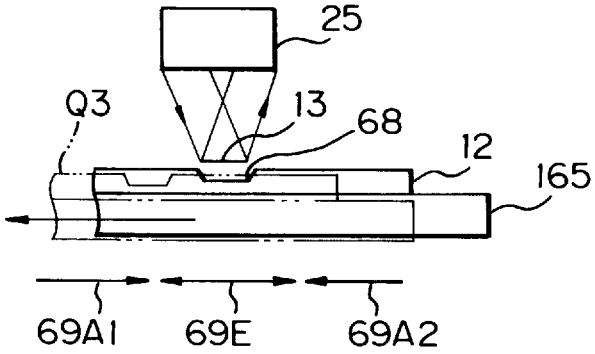
FIG. 11C is a schematic representation illustrating the detection area of multipoint AF sensor 25 passing a region with a groove-like structure on the wafer 12.

Finally, referring to FIG. 11C, the condition is described in which there is a region 68 on the surface of the wafer 12 that includes a groove-like structure inconvenient for the focusing and leveling control. One example of such region 68 with a groove-like structure is a region of a street line between the adjacent exposure areas. Further, when a scanning exposure type of projection exposure apparatus is used to print patterns for two or more chips within a single exposure area and then dicing apart the chips, then a region with a groove-like structure may exist between the chip sites (and thus at a midpoint in the scanning direction) in such a exposure area. In FIG. 11C, it is assumed that an exposure area on the wafer 12 has a region 68 with a groove-like structure, a step-and-scan type of projection exposure apparatus is used to carry out the exposure operation, and the scanning direction is the right-and-left direction in this figure.

When an exposure operation is carried out, the wafer stage 165 is moved in the right-to-left direction for scanning. During the time when the region 68 with the groove-like structure is moved within area 69A2, the multiplexor 153 of FIG. 10 is set to select the values supplied from the least-squares calculation unit 52, so that the focusing and levelling control is performed based on the measured values by the multipoint AF sensor 25. Thereafter, when the region 68 with the groove-like structure enters area 69E so that the detection area of the multipoint AF sensor 25 (the illumination area 13) overlaps the region 68 with the groove-like structure, and this is detected by the focusing-position-switch-decision unit 154, the multiplexor 153 is switched to select the values supplied from the wafer modelling unit 158, so that the control is performed such that the hypothetical surface may become and remain coincident with the image plane. The control mode is so switched because the focusing position measured by the multipoint AF sensor 25 is temporally lowered due to the groove-like structure as shown by the position Q3, and therefore if the focusing control were performed using the measured values from the multipoint AF sensor 25 when the region 68 is in area 69E, the surface of the wafer 12 would be temporally raised, resulting in a longer adjustment time required thereafter. The hypothetical surface defined for this purpose is a flat surface having no region with a groove-like structure, such as the region 68.

Thereafter, as the scanning exposure operation proceeds, the region 68 with the groove-like structure enters area 69A1, when the overlap between the detection area of the multipoint AF sensor 25 and the region 68 with the groove-like structure does no longer exist. When this is detected, the multiplexor 153 is switched to select the values supplied from the least-squares calculation unit 52, so that the focusing and leveling control is thereafter performed based on the measured values supplied from the multipoint AF sensor 25. By virtue of this control mode switch, the adjustment time (settling time) required just after the passing of the region 68 with groove-like structure is shortened, resulting in higher scanning velocities and enhanced throughput of the exposure process.

In the exemplified control sequence described above, the decision by the focusing-position-switch-decision unit 154 is made by comparing i) step-like structure data, which have been provided through the input/output device 160 as preparatory data relating to the position of the wafer 12 and ii) the current coordinates of the Z/tilt-stage 14 (hence of the wafer 12) measured by means of the laser interferometers 23X and 23Y. The step-like structure data relating to areas 66A and 66E described with reference to FIG. 11A, the step-like structure data relating to areas 67A and 67E described with reference to FIG. 11B and the steplike structure data relating to areas 69A and 69E are all input through the input/output device 160 and stored in the control unit 155. Further, an additional sensor 71 may be used for deciding the control mode switch.

Figure 12:
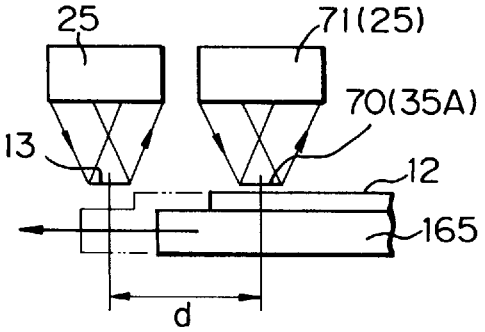
FIG. 12 is a schematic representation showing an arrangement including separate AF sensor for detecting any surface irregularities on the wafer provided separately from the multipoint AF sensor 25.

FIG. 12 shows an exemplified arrangement including an additional, separate AF sensor 71, which is independent of the multipoint AF sensor 25, for detecting the focusing position in a detection area 70 preceding in the scanning direction. In FIG. 12, the centers of the detection area 13 of the multipoint AF sensor 25 and the detection area 70 of the AF sensor 71 are distant in the direction parallel to the sheet surface of FIG. 12, and the distance between the centers is d. For the scanning exposure, the wafer stage 165 is moved in the right-to-left direction at a velocity Vw. During the scanning exposure operation, if the value of the focusing position determined by the AF sensor 71 changes from a value outside an allowable range to a value inside the range, then the multiplexor 153 will be switched to select the values supplied from the least-squares calculation unit 153 at the point of time d/Vw after the detection of this change. In this manner, the control mode switch may be achieved with precision and without need for predefining areas for indicating the points at which the control mode switch is to be made.

Further, since the embodiment described above uses prereading areas 35A and 35B, one prereading area 35A of FIG. 2 may be used as the detection area of FIG. 11. In such a case, the function of the AF sensor 71 may be advantageously performed by the multipoint AF sensor 25 of FIG. 1.

The surface of a wafer has only a limited flatness. In general, it is deformed from a flat plane to have a shallow, concave or convex shape of revolution having its axis centered to the wafer and perpendicular to the surface of the wafer. In order to account for the deformation of a wafer, the wafer modelling unit 158 utilizes a technique for adaptively modifying the wafer model as the wafer is moved in the X- and/or Y-directions. More specifically, this is achieved by sequentially modifying the wafer model while the focusing and leveling control is performed using the results of measurement performed by the multipoint AF sensor 25.

Figure 13A:
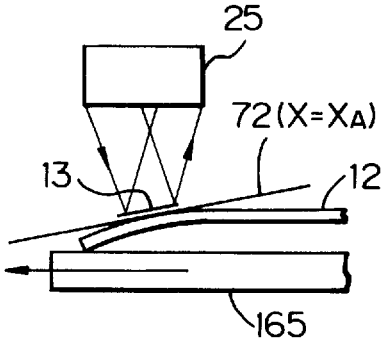
FIGS. 13A and 13B are schematic representations illustrating an exemplified method of defining a wafer model where the wafer has a deformed surface.
Figure 13B:
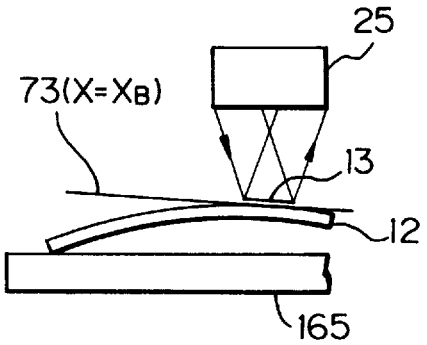

FIGS. 13A and 13B show a wafer with a deformed surface, which is held on the wafer stage 165 moving in the right-to-left direction. When, as shown in FIG. 13A, the wafer stage 165 is at a position where the X-coordinate of the wafer stage 165 is XA, the wafer model is defined as an approximate plane representing that portion of the wafer surface which is confined in the illumination field 13 in which the measurement is carried out by the multipoint AF sensor 25; in other words, the wafer model is defined as a plane tangent to the surface of the wafer 12 at the center of the illumination field 13. Thereafter, when the wafer stage 165 reaches a position where the X-coordinate of the wafer stage 165 is XB, as shown in FIG. 13B, the wafer model is defined as an approximate plane representing that portion of the wafer surface which is then confined in the illumination field 13 in which the measurement is carried out by the multipoint AF sensor. When the multiplexor 153 of FIG. 10 is switched to select the values supplied from the wafer modelling unit 158, the latest approximate plane defined based on the latest measured values obtained by the multipoint AF sensor 25 is used as the wafer model. In this manner, a shorter initial adjustment time required just after a control mode switch may be achieved even when the wafer is deformed.

In FIG. 2, the measurement points $P_{21}$–$P_{43}$ for determining the tilt angles and the focusing position are distributed within the illumination field 13. However, they may be distributed beyond the border of the illumination field 13. Further, the total number and the arrangement of the entire set of the measurement points $P_{11}$–$P_{53}$ are not limited to those shown in FIG. 2. For example, the measurement points may be arranged in an array comprising rows staggered in the X-direction.

Further, in the embodiment described above, the tilt angles of the illumination field 13 on the wafer 12 are determined by using the multipoint AF sensor 25. Alternatively, they may be determined by using a levelling sensor of the type utilizing an obliquely incident collimated beam, in which a single-point AF sensor is used in place of the multipoint AF sensor, a collimated beam is illuminated obliquely onto the surface of the wafer 12, and the lateral shift of the reflecting beam is used so as to determine the tilt angles of the surface.

Moreover, the present invention may be also applied to a one-shot exposure type of projection exposure apparatus (such as a stepper). In the case where the present invention is applied to a one-shot exposure type of projection exposure apparatus, there may be provided, as with the exemplified arrangement of FIG. 11, an additional AF sensor independent of the main AF sensor, and the control mode switch is performed using the measured values from the additional AF sensor during the stepping of the wafer.

As understood, the present invention is not limited to the embodiment shown and described above, but various other arrangements and modifications can made without departing the spirit and the scope of the present invention.

According to an exposure apparatus of the present invention, in such regions on the substrate (such as a wafer) where the focusing control is essentially unnecessary and there are surface irregularities, or in such regions outside the surface of the substrate, the focusing position of the substrate is controlled based on the height data determined by a stage focusing position detection sensor for making measurement with respect to the stage (such as an encoder), so that the deviation (error) of the focusing position from the desired position, which exists when the AF control restarts using a substrate focusing position detection sensor for making measurement with respect to the substrate, may be reduced. This provides an advantage that a shorter initial adjustment time (settling time) required just after the restart of such AF control and a higher throughput of the exposure process may be achieved.

Further, according to an exposure apparatus of the present invention, in the case a scanning projection exposure technique is used to expose an exposure area on a substrate and where the exposure area includes a groove-like structure such as a border between the adjacent chips (a street line), the focusing position of the substrate is controlled, in that region of the exposure area which includes the groove-like structure, based on the height data determined by a stage focusing position detection sensor for making measurement with respect to the stage. This provides an advantage that a shorter initial adjustment time (settling time) may be achieved when the focusing control using a substrate focusing position detection sensor for making measurement with respect to the substrate has restarted.

Moreover, in the case where the focusing position is predicted based on the height data determined by a stage focusing position detection sensor for making measurement with respect to the stage and a predetermined model, the focusing position of the substrate may be controlled based on the height data determined by the stage focusing position detection sensor, so that substantial precision may be achieved even when the substrate has a deformed surface. This provides an advantage that a shorter initial adjustment time (settling time) may be achieved when the focusing control using a substrate focusing position detection sensor for making measurement with respect to the substrate has restarted.

What is claimed is:

1. A projection exposure apparatus having a projection optical system with an optical axis, in which a mask and a photosensitized substrate are moved for scanning in synchronism with each other and relative to said projection optical system while an image of a portion of a pattern on said mask is projected through said projection optical system onto a predetermined exposure area on said substrate, said projection exposure apparatus comprising:

a position detection sensor for detecting i) a tilt angle of the surface of said predetermined exposure area relative to a plane perpendicular to said optical axis of said projection optical system and ii) a focusing position of the surface of said predetermined exposure area measured in the direction of said optical axis of said projection optical system;

a tilt angle control unit for controlling the surface of said substrate based on the tilt angle detected by said position detection sensor so as to cause the surface of said substrate to be parallel to a first reference plane, said first reference plane being defined by a projected image of said mask formed through said projection optical system; and a focusing position control unit for controlling said substrate based on i) the focusing position of the surface of said predetermined exposure area and ii) a second reference plane, said second reference plane being defined by a distribution of focusing positions obtained when said mask is moved for scanning.

2. A projection exposure apparatus according to claim 1, wherein:

said focusing position control unit is so arranged as to control said substrate based on i) the position of said first reference plane measured in the direction of said optical axis of said projection optical system and ii) said second reference plane.

3. A projection exposure apparatus according to claim 1, wherein:

said tilt angle control unit and said focusing position control unit are provided with a storage unit for storing tilt angles of said first reference plane and of said second reference plane relative to said plane perpendicular to said optical axis of said projection optical system.

4. A projection exposure apparatus according to claim 3, wherein:

said storage unit stores the position of said first reference plane measured in the direction of said optical axis of said projection optical system.

5. A projection exposure apparatus according to claim 4, wherein:

i) the tilt angle of said first reference plane relative to said plane perpendicular to said optical axis of said projection optical system and ii) the position of said first reference plane measured in the direction of said optical axis of said projection optical system are determined from projected images obtained by positioning said mask stationary in the midpoint in the scanning direction and then moving said substrate in the direction of said optical axis of said projection optical system as well as in directions in said plane perpendicular to said optical axis of said projection optical system.

6. A projection exposure apparatus having a projection optical system with an optical axis, in which a mask and a photosensitized substrate are moved for scanning in synchronism with each other and relative to said projection optical system while an image of a portion of a pattern on said mask is projected through said projection optical system onto a predetermined exposure area on said substrate, said projection exposure apparatus comprising:

a detection circuit for detecting i) a tilt angle of said substrate relative to a plane perpendicular to said optical axis of said projection optical system and ii) a focusing position of said substrate measured in the direction of said optical axis of said projection optical system;

a tilt angle calculation circuit for calculating the difference between i) a tilt angle of a first reference plane relative to said plane perpendicular to said optical axis of said projection optical system, said first reference plane being defined by a projected image of said mask formed through said projection optical system, and ii) the tilt angle detected by said detection circuit; and a focusing position calculation circuit for calculating the difference between i) the focusing position of the surface of said predetermined exposure area and ii) focusing positions obtained when said mask is moved for scanning.

7. A projection exposure apparatus according to claim 6, wherein:

said focusing position calculation circuit comprises a focusing position correction circuit for calculating the difference between i) the position of said first reference plane measured in the direction of said optical axis of said projection optical system and ii) focusing positions obtained when said mask is moved for scanning.

8. A projection exposure apparatus according to claim 6, further comprising:

a control unit for controlling said substrate based on i) the tilt angle difference calculated by said tilt angle calculation circuit and ii) the focusing position difference calculated by said focusing position calculation circuit.

9. A method of exposing a circuit substrate by using a projection optical system with an optical axis, in which a mask and a photosensitized substrate are moved for scanning in synchronism with each other and relative to said projection optical system while an image of a portion of a pattern on said mask is projected through said projection optical system onto a predetermined exposure area on said substrate, said method comprising the steps of:

a) detecting i) a tilt angle of the surface of said predetermined exposure area relative to a plane perpendicular to said optical axis of said projection optical system and ii) a focusing position of the surface of said predetermined exposure area measured in the direction of said optical axis of said projection optical system;

b) controlling the surface of said predetermined exposure area based on the detected tilt angle so as to cause the surface of said predetermined exposure area to be parallel to a first reference plane, said first reference plane being defined by a projected image of said mask formed through said projection optical system; and c) controlling said substrate based on i) the focusing position of the surface of said predetermined exposure area and ii) a second reference plane, said second reference plane being defined by a distribution of focusing positions obtained when said mask is moved for scanning.

10. A method of exposing a circuit substrate according to claim 9, wherein:

said distribution of focusing positions defining said second reference plane is defined depending on the focusing position of said first reference plane.

11. A method of exposing a circuit substrate by using a projection optical system with an optical axis, in which a mask and a photosensitized substrate are moved for scanning in synchronism with each other and relative to said projection optical system while an image of a portion of a pattern on said mask is projected through said projection optical system onto a predetermined exposure area on said substrate, said method comprising the steps of:

a) detecting i) a tilt angle of the surface of said predetermined exposure area relative to a plane perpendicular to said optical axis of said projection optical system and ii) a focusing position of the surface of said predetermined exposure area measured in the direction of said optical axis of said projection optical system;

b) calculating the difference between i) a tilt angle of a first reference plane relative to said plane perpendicular to said optical axis of said projection optical system, said first reference plane being defined by a projected image of said mask formed through said projection optical system, and ii) the tilt angle of the surface of said predetermined exposure area detected in said step a; and c) calculating a focusing error between i) the focusing position of the surface of said predetermined exposure area and ii) a second reference plane, said second reference plane being defined by a distribution of focusing positions obtained when said mask is moved for scanning.

12. A method of exposing a circuit substrate according to claim 11, further comprising the steps of:

d) calculating the difference between i) the focusing error calculated in said step c and ii) the focusing position of the surface of said predetermined exposure area detected in said step a; and e) adjusting said substrate based on i) the tilt angle difference calculated in said step b and ii) the focusing position difference calculated in said step d.

13. A method of exposing a circuit substrate according to claim 11, wherein:

the focusing error calculated in said step c varies depending on the coordinate of said substrate in the scanning direction.

14. An exposure apparatus including a projection optical system with an optical axis for projecting a pattern on a mask onto a photosensitized substrate and a substrate stage for moving said substrate on the image side of said projection optical system, said exposure apparatus comprising:

a substrate focusing position detection unit for detecting a first focusing position of said substrate measured in the direction of said optical axis of said projection optical system;

a stage focusing position detection unit for detecting a second focusing position of said substrate stage measured in the direction of said optical axis of said projection optical system;

a focusing position selection unit for selecting one of said first and second focusing positions depending on the condition of the surface of said substrate; and a focusing position control unit for controlling the focusing position of said substrate depending on the focusing position selected by said focusing position selection unit.

15. An exposure apparatus according to claim 14, wherein:

said stage focusing position detection unit comprises:

a sensor for detecting the height of said substrate stage; and a substrate modelling unit for detecting said second focusing position based on i) the height detected by said sensor and ii) a predefined substrate model.

16. An exposure apparatus according to claim 14, wherein:

said substrate focusing position detection unit is so arranged as to detect a tilt angle of said substrate; and said stage focusing position detection unit is so arranged as to detect a tilt angle of said substrate stage.

17. An exposure apparatus according to claim 14, further comprising:

a substrate step-like structure detection unit for detecting a step-like structure on said substrate, said substrate step-like structure detection unit being independent of said substrate focusing position detection unit;

wherein said focusing position selection unit is so arranged as to select one of said first and second focusing positions depending on the results of the detection of the step-like structure by said substrate step-like structure detection unit.

18. An exposure apparatus according to claim 14, wherein:

said substrate focusing position detection unit is so arranged as to perform focusing position detection operation for both i) inside projection exposure areas on said substrate in which said pattern on said mask is projected and ii) outside said projection exposure areas; and said focusing position selection unit is so arranged as to select one of said first and second focusing positions depending on the results of the focusing position detection operations performed outside said projection exposure areas.

19. A scanning exposure apparatus for serially transferring an image of a pattern on a mask onto a photosensitized substrate, comprising:

a projection optical system with an optical axis for projecting an image of a portion of said pattern on said mask onto a predetermined exposure area on said substrate;

a substrate stage for moving said substrate on the image plane side of said projection optical system;

a drive system for moving said mask and said substrate in synchronism with each other and relative to said projection optical system;

a substrate focusing position detection sensor for detecting a first focusing position of said substrate measured in the direction of said optical axis of said projection optical system;

a stage focusing position detection sensor for detecting a second focusing position of said substrate stage measured in the direction of said optical axis of said projection optical system;

a storage unit for storing data relating to a step-like structure on the surface of said substrate;

a focusing position selection unit for selecting one of said first and second focusing positions depending on i) said data relating to the step-like structure on the surface of said substrate stored in said storage unit and ii) the position of said substrate driven by said drive unit; and a focusing position control unit for controlling the focusing position of said substrate depending on the focusing position selected by said focusing position selection unit.

20. A scanning exposure apparatus according to claim 19, wherein:

said stage focusing position detection unit comprises:

a sensor for detecting the height of said substrate stage; and a substrate modelling unit for detecting said second focusing position based on i) a predefined substrate model and ii) the height detected by said sensor.

21. A method of exposing a circuit substrate by using a projection optical system with an optical axis, in which an image of a portion of a pattern on a mask is projected through said projection optical system onto a predetermined exposure area on a photosensitized substrate, said method comprising the steps of:

a) detecting a first focusing position of said predetermined exposure area on said substrate measured in the direction of said optical axis of said projection optical system;

b) detecting a second focusing position of said substrate stage measured in the direction of said optical axis of said projection optical system;

c) selecting one of said first and second focusing positions depending on the condition of the surface of said substrate; and d) controlling the focusing position of said substrate depending on the selected focusing position.

22. A method of exposing a circuit substrate according to claim 21, wherein:

a1) said step of detecting said first focusing position includes detecting a tilt angle of said substrate; and b1) said step of detecting said second focusing position includes detecting a tilt angle of said substrate stage.

23. A method of exposing a circuit substrate according to claim 21, wherein:

said step of detecting said second focusing position comprises the steps of:

b2) detecting the height of said substrate stage; and b3) detecting said second focusing position based on i) a predefined substrate model and ii) the detected height of said substrate stage.

24. A method of exposing a circuit substrate according to claim 21, further comprising the step of:

c1) selecting one of said first and second focusing positions depending on the condition of the surface of said substrate, which condition is stored in a storage unit.

25. A method of exposing a circuit substrate by using a projection optical system with an optical axis, in which a mask having a pattern formed thereon is illuminated so that an image of a portion of said pattern on said mask is projected through said projection optical system onto a predetermined exposure area on a photosensitized substrate, said method comprising the steps of:

a) detecting a first focusing position of said predetermined exposure area on said substrate measured in the direction of said optical axis of said projection optical system;

b) detecting a second focusing position of said substrate stage measured in the direction of said optical axis of said projection optical system;

c) selecting one of said first and second focusing positions depending on stored step-like structure data; and d) controlling the focusing position of said substrate depending on the selected focusing position.

26. A method of exposing a circuit substrate according to claim 25, wherein:

said step of detecting said second focusing position comprises the steps of:

detecting the height of said substrate stage; and detecting said second focusing position based on i) a predefined substrate model and ii) the detected height of said substrate stage.

* * * * *